US012674935B2

(12) United States Patent
Lu et al.

(10) Patent No.: US 12,674,935 B2
(45) Date of Patent: Jul. 7, 2026

(54) SEMICONDUCTOR STITCH STRUCTURE AND METHOD FOR FORMING THE SAME

(71) Applicant: TAIWAN SEMICONDUCTOR MANUFACTURING COMPANY LTD., Hsinchu (TW)

(72) Inventors: You-Cheng Lu, Tainan City (TW); Stefan Rusu, Sunnyvale, CA (US); Lan-Chou Cho, Hsinchu City (TW); Ming Yang Jung, Kaohsiung City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 287 days.

(21) Appl. No.: 18/344,826

(22) Filed: Jun. 29, 2023

(65) Prior Publication Data

US 2025/0004201 A1 Jan. 2, 2025

(51) Int. Cl.
| *G02B 6/125* | (2006.01) |
| *G02B 6/124* | (2006.01) |
| *G02B 6/13* | (2006.01) |
| *G03F 7/00* | (2006.01) |

(52) U.S. Cl.
CPC ............. *G02B 6/125* (2013.01); *G02B 6/124* (2013.01); *G02B 6/13* (2013.01); *G03F 7/0005* (2013.01); *G03F 7/70475* (2013.01)

(58) Field of Classification Search
CPC .......... G02B 6/125; G02B 6/124; G02B 6/13; G03F 7/0005; G03F 7/70475
See application file for complete search history.

(56) References Cited

U.S. PATENT DOCUMENTS

| 10,867,982 | B1* | 12/2020 | Yu ........................... H01L 24/16 |
| 10,996,081 | B2 | 5/2021 | Qamar et al. |
| 11,073,737 | B2 | 7/2021 | Masini et al. |
| 2022/0365278 | A1 | 11/2022 | Yu et al. |
| 2024/0201439 | A1* | 6/2024 | Kuo ................... G02B 6/12002 |

FOREIGN PATENT DOCUMENTS

TW        202238195 A      10/2022

OTHER PUBLICATIONS

U.S. Appl. No. 11/960,122 B2 is the US counterpart of TW 202238195 A.

* cited by examiner

*Primary Examiner* — Michael P Mooney
(74) *Attorney, Agent, or Firm* — WPAT LAW; Anthony King

(57) ABSTRACT

A semiconductor structure includes a plurality of semiconductor dies, a first stitch structure disposed in the plurality of semiconductor dies, and a second stitch structure disposed in at least two adjacent semiconductor dies of the plurality of semiconductor dies. The semiconductor dies are arranged to form a column or a row. The first stitch structure crosses all interfaces between the semiconductor dies. The second stitch structure crosses an interface between the at least two adjacent semiconductor dies.

20 Claims, 25 Drawing Sheets

SEMICONDUCTOR STITCH STRUCTURE AND METHOD FOR FORMING THE SAME

BACKGROUND

Photonic devices are used in integrated circuits (ICs) in order to carry signals from one component to another component faster than using electrical signals. Electrical signals are converted into optical signals at one end of a waveguide, the optical signals propagate along the waveguide, and the optical signals are converted back into electrical signals at the other end of the waveguide. In such way, optical and electrical signaling and processing are combined for signal transmission.

Accordingly, photonic devices that include integrated optical components and electrical components are used for conversion between optical signals and the electrical signals, as well as processing of the optical signals and the electrical signals. The photonic devices are therefore sensitive to process variation which impacts performance of the photonic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
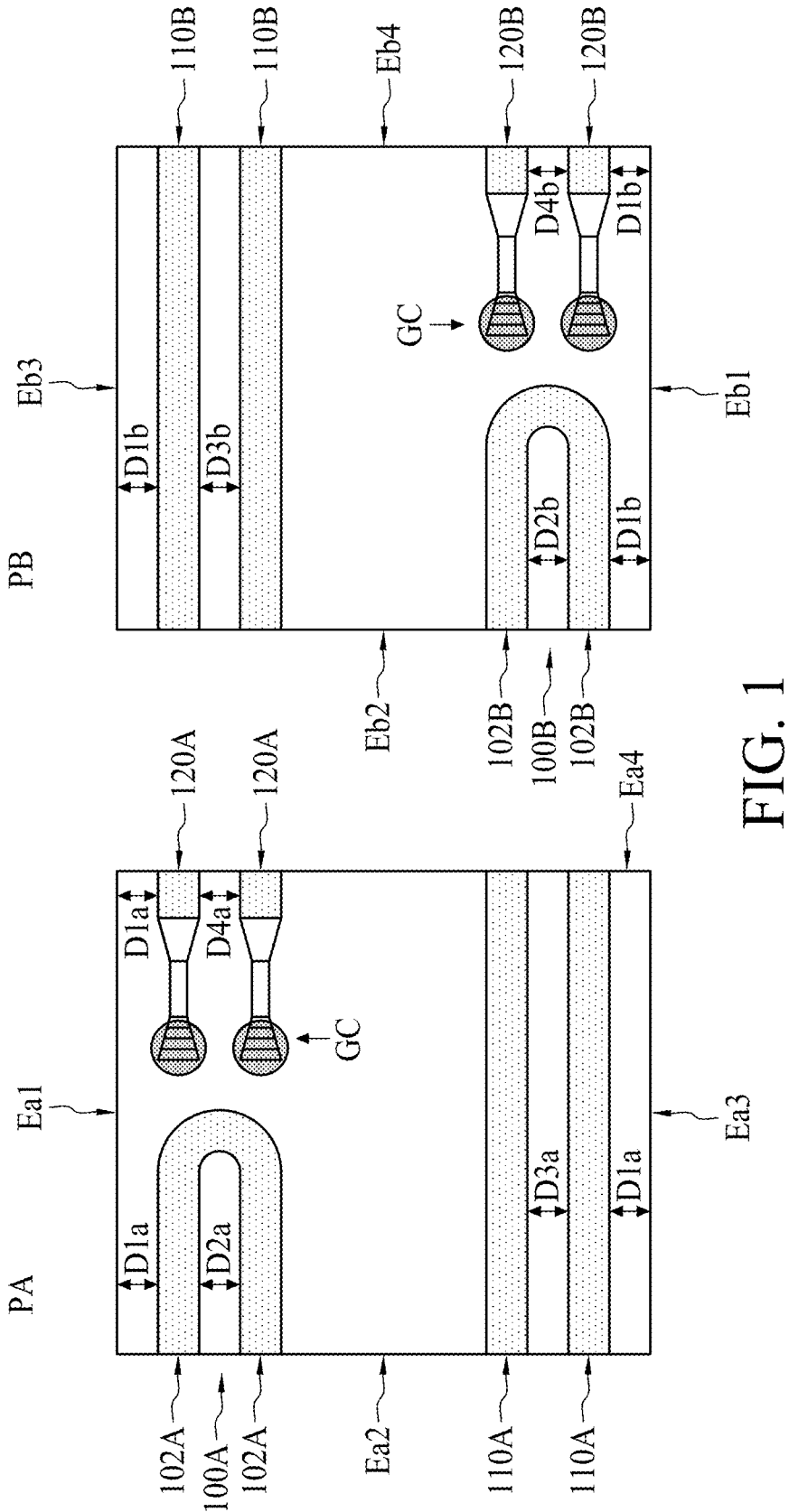
FIG. 1 is a schematic view of patterns according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper." "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective test measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Components such as waveguides of photonic devices can be formed in a sequence of successive lithography steps including photolithography, layer etch, and layer growth or deposition to form a pattern which defines component structures within an IC. During the photolithography step, exposures are repeatedly performed through a whole wafer. It is found that a shift of a photomask used in the exposure consequently causes a shift in formed patterns. In some comparative approaches, a shift in waveguide patterns may cause a variation of width and/or thickness of a waveguide, and a disconnection of the waveguide. Such issues lead to loss of coupling efficiency.

On the other hand, a waveguide that extends between two adjacent dies, i.e., that includes a segment in one die and another segment in another die, may be referred to as a stitch waveguide. The abovementioned photomask shift may cause stitch loss due to misalignment of two segments. It has been found that, when optical signals propagating through a stitch waveguide passing through more than one die, the stitch loss is increased. Further, such stitch loss cannot be quantified.

The present disclosure therefore provides a semiconductor stitch pattern and a semiconductor stitch structure that monitors manufacturing operations. In some embodiments, the semiconductor stitch structure includes the semiconductor stitch pattern. The semiconductor stitch pattern monitors a mask shifting issue. Accordingly, the manufacturing operations can be adjusted promptly. The semiconductor stitch structure monitors a stitch loss of a to-be-formed waveguide. Accordingly, countermeasures can be taken to mitigate the stitch loss issue.

FIG. 1 is a schematic view of patterns according to aspects of the present disclosure in one or more embodiments. In some embodiments, a pattern PA and a pattern PB are provided. The pattern PA and the pattern PB may be formed on different photomasks. In other embodiments, the pattern PA and the pattern PB may be formed on one photomask. Further, each of the pattern PA and the pattern PB corresponds to one die, but the disclosure is not limited thereto. In some embodiments, the pattern PA and the pattern PB include same pattern segments but different arrangements.

As shown in FIG. 1, the pattern PA has a U-shaped segment 100A and the pattern PB has a U-shaped segment 100B. The U-shaped segment 100A and the U-shaped segment 100B are identical. The U-shaped segment 100A is separated from an edge Ea1 of the pattern PA by a distance D1$a$, and the U-shaped segment 100B is separated from an edge Eb1 of the pattern PB by a distance D1$b$. The distance D1$a$ and the distance D1$b$ are equal. The U-shaped segment 100A has two ends 102A adjacent to another edge Ea2 of the pattern PA, and the U-shaped segment 100B has two ends 102B adjacent to another edge Eb2 of the pattern PB. Further, the edge Ea1 of the pattern PA is perpendicular to the edge Ea2 of the pattern PA, and the edge Eb1 of the pattern PB is perpendicular to the edge Eb2 of the pattern PB. The two ends 102A of the U-shaped segment 100A are separated from each other by a distance D2$a$, and the two ends 102B of the U-shaped segment 100B are separated from each other by a distance D2$b$. The distance D2$a$ and the distance D2$b$ are equal. In some embodiments, the U-shaped segment 100A and the U-shaped segment 100B are waveguide patterns.

As shown in FIG. 1, the pattern PA and the pattern PB respectively include a plurality of long segments. For example, the pattern PA may have two long segments 110A, and the pattern PB may have two long segments 110B. The long segments 110A and the long segments 110B are identical. One of the long segments 110A is separated from an edge Ea3 of the pattern PA by the distance D1$a$, and one of the long segments 110B is separated from an edge Eb3 of the pattern PB by the distance D1$b$. As shown in FIG. 1, the edge Ea1 and the edge Ea3 of the pattern PA are parallel to each other, and the edge Eb1 and the edge Eb3 of the pattern PB are parallel to each other. The long segments 110A extend from the edge Ea2 to an opposite edge Ea4 of the pattern PA. The edge Ea2 and the edge Ea4 of the pattern PA are parallel to each other; therefore, two ends of each long segment 110A are respectively adjacent to the edges Ea2 and Ea4 of the pattern PA. The long segments 110B extend from the edge Eb2 to an opposite edge Eb4 of the pattern PB. The edge Eb2 and the edge Eb4 of the pattern PB are parallel to each other; therefore, two ends of each long segment 110B are respectively adjacent to the edges Eb2 and Eb4 of the pattern PB. The two long segments 110A are separated from each other by a distance D3$a$, and the two long segments 110B are separated from each other by a distance D3$b$. Further, the distance D3$a$ and the distance D3$b$ are equal. In some embodiments, the long segments 110A and the long segments 110B are waveguide patterns.

Further, the distance D2$a$ in the pattern PA and the distance D3$b$ in the pattern PB are equal, while the distance D3$a$ in the pattern PA and the distance D2$b$ in the pattern PB are equal.

As shown in FIG. 1, the pattern PA and the pattern PB respectively include a plurality of segments including a grating coupler (GC). Additionally, such segments are referred to as GC segments. In some embodiments, the pattern PA may have two GC segments 120A, and the pattern PB may have two GC segments 120B. The GC segments 120A and the GC segments 120B are identical. One of the GC segments 120A is separated from the edge Ea1 of the pattern PA by the distance D1$a$, and one of the GC segments 120B is separated from the edge Eb1 of the pattern PB by the distance D1*b*. An end of the GC segment 120A is adjacent to the edge Ea4 of the pattern PA, and an end of the GC segment 120B is adjacent to the edge Eb4 of the pattern PB. The two GC segments 120A are separated from each other by a distance D4*a*, and the two GC segments 120B are separated from each other by a distance D4*b*.

Further, the distance D4*a* in the pattern PA and the distance D3*b* in the pattern PB are equal, while the distance D4*b* in the pattern PB and the distance D3*a* in the pattern PA are equal.

Still referring to FIG. 1, the pattern PA and the pattern PB have identical segments but different arrangements. In the pattern PA, the U-shaped segment 100A and the two GC segments 120A are disposed in an upper portion of the pattern PA, while the two long segments 110A are disposed in a lower portion of the pattern PA. In contrast to the pattern PA, the two long segments 110B are disposed in an upper portion of the pattern PB, while the U-shaped segment 100B and the two GC segments 120B are disposed in a lower portion of the pattern PB.

Figures 2, 3A:
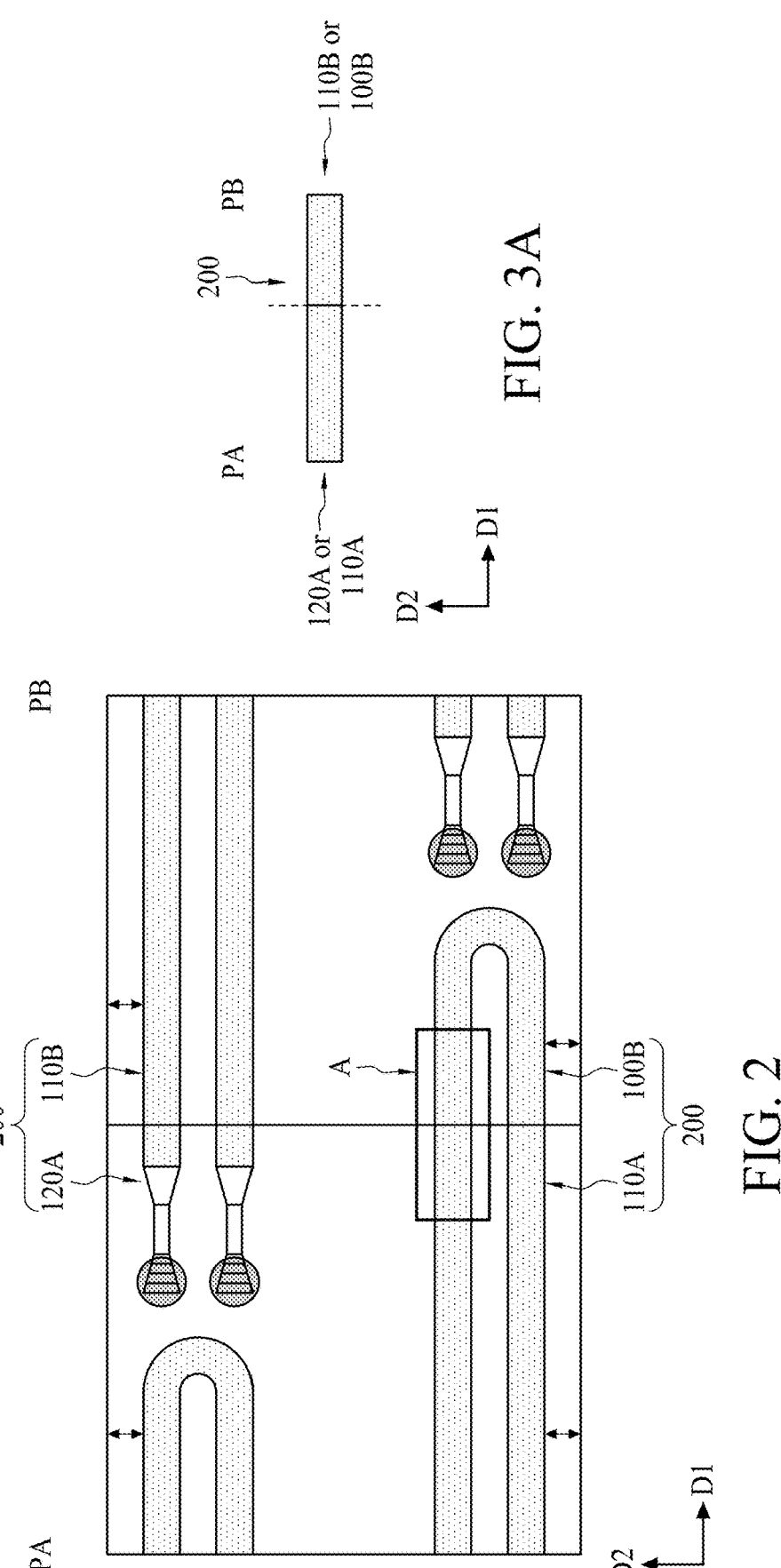
FIG. 2 is a schematic view of a stitch pattern according to aspects of the present disclosure in one or more embodiments.
FIGS. 3A to 3C are enlarged views of a portion A of FIG. 2 according to aspects of the present disclosure in one or more embodiments.

The pattern PA and the pattern PB are used to form stitch patterns 200 in adjacent dies, as shown in FIG. 2. In some embodiments, the stitch pattern 200 is formed by the two long segments 110A of the pattern PA and the U-shaped segment 100B of the pattern PB. In some embodiments, the stitch pattern 200 is formed by the two GC segments 120A of the pattern PA and the two long segments 110B of the pattern PB.

Referring to FIG. 3A, in some embodiments, each of the segments of the patterns PA and PB may have a consistent width. Further, each of the segments in the pattern PA and the pattern PB has a same width. In some embodiments, the widths of the segments of the patterns PA and PB are greater than 0.1 micrometer, but the disclosure is not limited thereto.

Figures 3B, 3C:
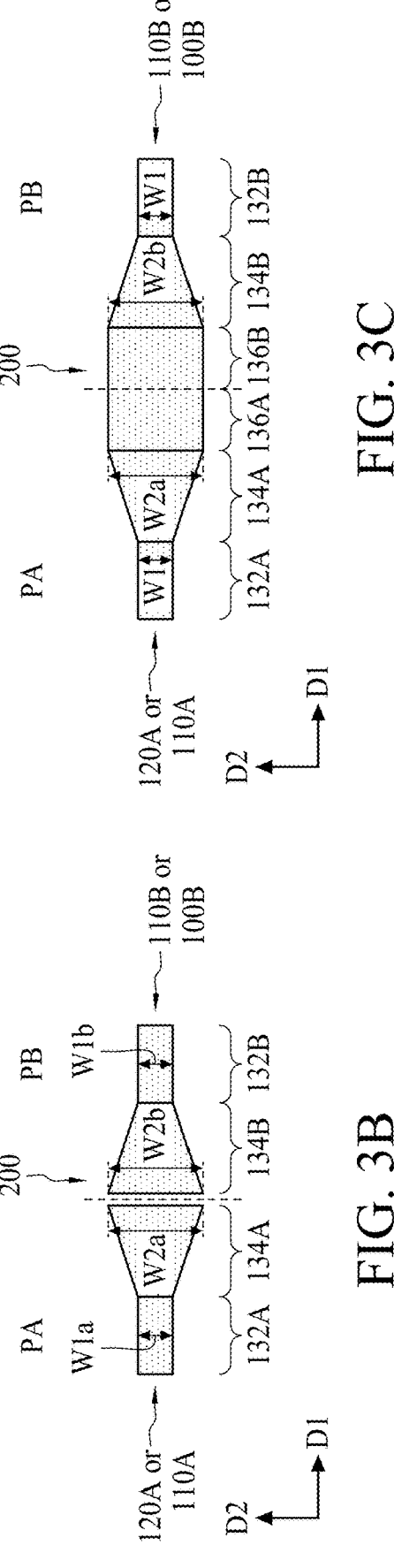

Referring to FIG. 3B, in some embodiments, the segments of the patterns PA and PB may have inconsistent widths. For example, the segment of the pattern PA has a first portion 132A and a second portion 134A, and the segment of the pattern PB has a first portion 132B and a second portion 134B. The second portion 134A is adjacent to one of the edges of the pattern PA, and the second portion 134B is adjacent to one of the edges of the pattern PB. Therefore, the stitch pattern 200 includes the first portion 132A and the second portion 134A of the segment of the pattern PA, and the first portion 132B and the second portion 134B of the segment of the pattern PB. The second portions 134A and 134B are disposed between the first portion 132A of the pattern PA and the first portion 132B of the pattern PB. A width W1*a* of the first portion 132A and a width W1*b* of the first portion 132B are equal. In some embodiments, the width W1*a* of the first portion 132A and the width W1*b* of the first portion 132B are less than 0.1 micrometer. The second portions 134A and 134B may have a tapered profile. In some embodiments, an end of the second portion 134A that is coupled to the first portion 132A has the width W1*a*, and another end of the second portion 134A that is coupled to the second portion 134B of the pattern PB has a width W2*a* greater than the width W1*a*. Similarly, an end of the second portion 134B that is coupled to the first portion 132B has the width W1*b*, and another end of the second portion 134B that is coupled to the second portion 134A of the pattern PA has a width W2*b* greater than the width W1*b*. The second portions 134A and 134B therefore are referred to as tapered portions. Further, the width W2*a* and the width W2*b* are equal. In some embodiments, the width W2*a* and the width W2*b* are greater than 0.1 micrometer, but the disclosure is not limited thereto.

Referring to FIG. 3C, in some embodiments, the pattern PA may further include a third portion 136A, and the pattern PB may further include a third portion 136B. The third portions 136A and 136B respectively have a consistent width. In such embodiments, the third portions 136A and 136B are disposed between the second portions 134A and 134B in the stitch pattern 200. The third portion 136A has the width W2*a*, and the third portion 136B has the width W2*b*. In such embodiments, the width of the second portion 134A increases from the width W1*a* of the first portion 132A to the width W2*a* of the third portion 136A. Similarly, the width of the second portion 134B increases from the width W1*b* of the first portion 132B to the width W2*b* of the third portion 136B. The second portions 134A and 134B therefore are referred to as tapered portions.

Figures 4, 5A, 5B:
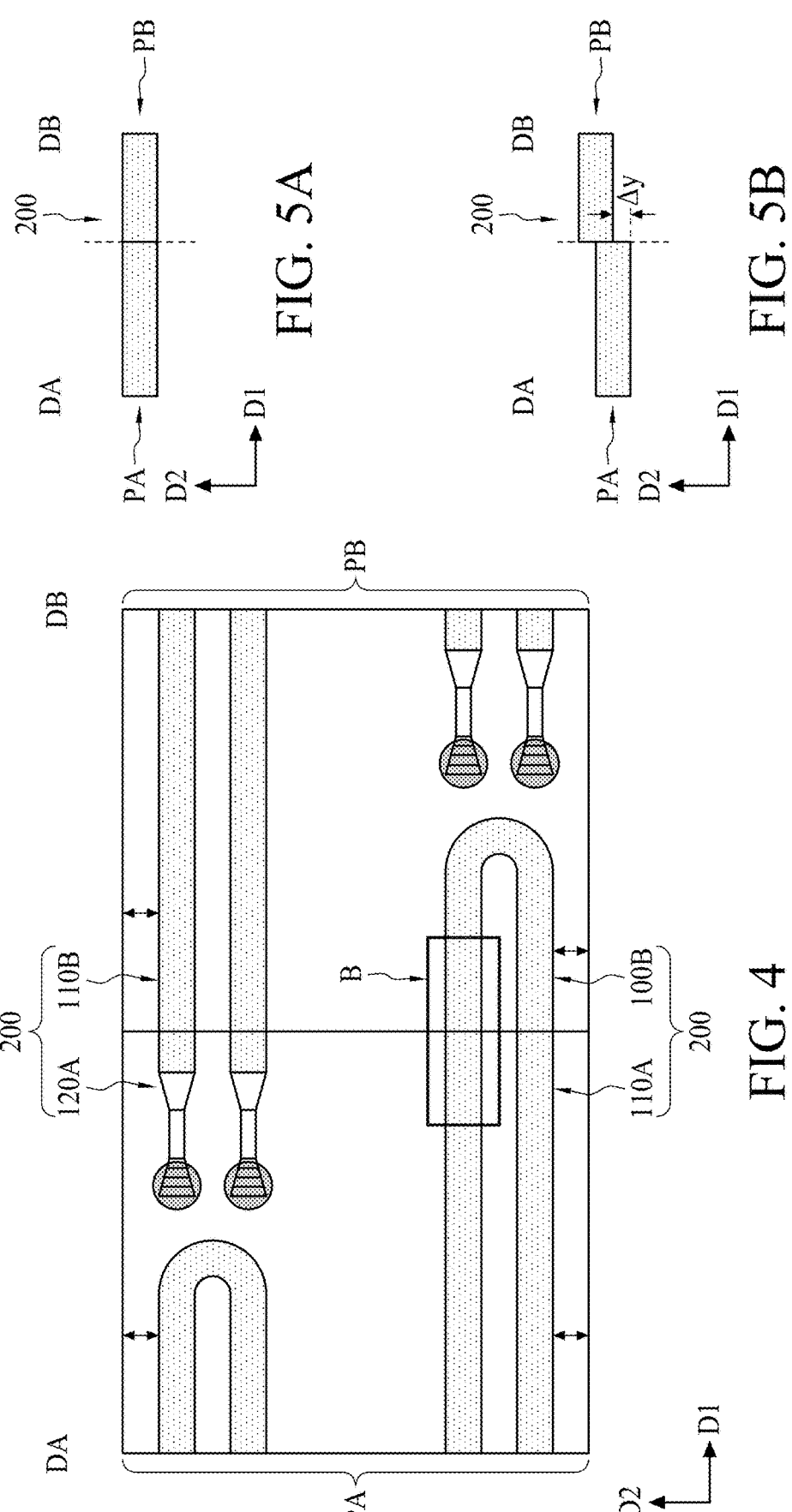
FIG. 4 is a schematic view of a stitch pattern according to aspects of the present disclosure in one or more embodiments.
FIGS. 5A to 5D are enlarged views of a portion B of FIG. 4 according to aspects of the present disclosure in one or more embodiments.

The stitch pattern 200 is used to monitor a shift of the masks involved in the photolithography operations. The corresponding operations are reflected schematically in a process flow shown in FIG. 18. Referring to FIG. 4, in some embodiments, the masks used in the photolithography step should be aligned from die to die, and the stitch pattern 200 is transferred from the masks to adjacent dies DA and DB. In such embodiments, segments that form the stitch pattern 200 should be aligned with each other along a first direction D1 and a second direction D2, as shown in FIG. 5A.

In some embodiments, the masks may be shifted along the second direction D2. In such embodiments, the segments may be offset along the direction D2, and a deviation Δy may be observed in a stitch pattern 200, as shown in FIG. 5B. Accordingly, by monitoring the deviation Δy, an unwanted shift of the masks along the second direction D2 is easily detected.

Figure 5C:
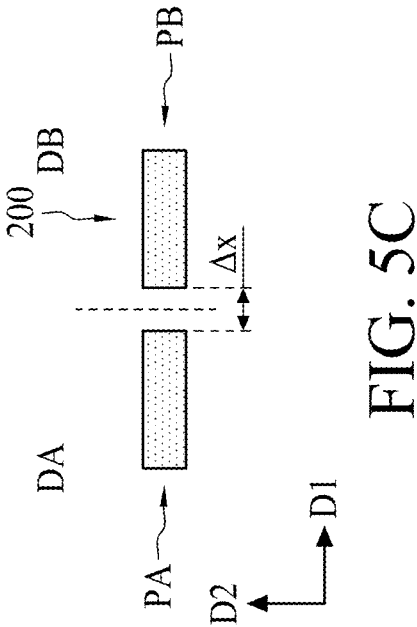

Referring to FIG. 5C, in some embodiments, the masks may be shifted along the first direction D1. The shifting of the masks may be eccentric to a boundary of the adjacent dies DA and DB. In such embodiments, the segment of the pattern PA and the segment of the pattern PB are separated from each other, and a spacing distance Δx may be observed in the stitch pattern 200, as shown in FIG. 5C. Accordingly, by monitoring the spacing distance Δx, an unwanted shift of the mask along the first direction D1 is easily detected.

Figure 5D:
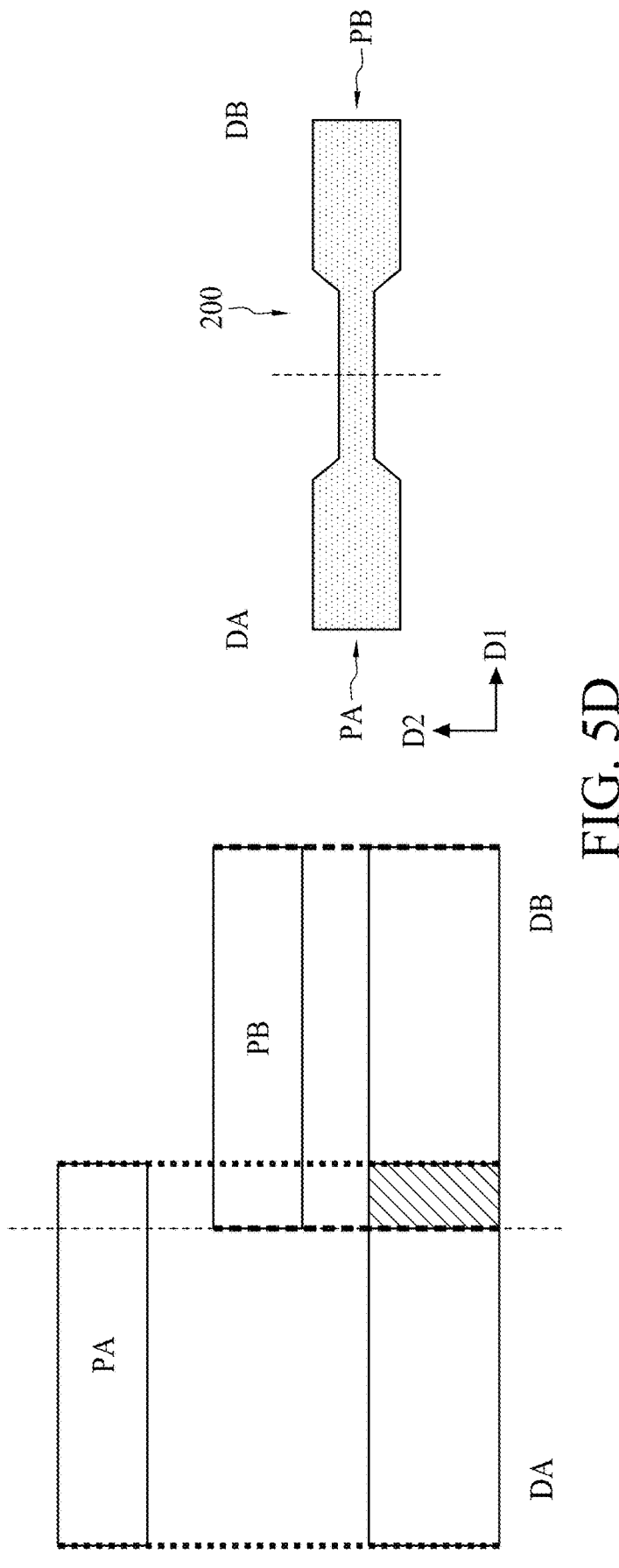

Referring to FIG. 5D, in some embodiments, the masks may be shifted along the first direction D1. The shifting of the masks may be concentric to the boundary of the adjacent dies DA and DB. In such embodiments, the segment of the pattern PA overlaps the segment of the pattern PB. Further, a width of a portion of the stitch pattern 200 formed by the overlapping segments may be less than widths of other portions of the stitch pattern 200 due to the overlap. Thus, a neck portion may be observed in the stitch pattern 200, and an unwanted shift of the mask along the first direction D1 is detected.

Further, the pattern PA and the pattern PB may be arranged in various ways to form stitch structures according to different embodiments. For example, referring to FIG. 6A, by arranging the pattern PA and the pattern PB in an order of PA-PB-PA, a stitch structure 300 is formed in adjacent semiconductor dies 400, 401 and 402. In some embodiments, the semiconductor dies 400, 401 and 402 are arranged to form a row. In some embodiments, the stitch structure 300 is a semiconductor component, such as a semiconductor waveguide. In some embodiments, the stitch structure 300 is a silicon nitride waveguide, but the disclosure is not limited thereto. In some embodiments, the stitch structure 300 is referred to as test keys. In some embodiments, the stitch structure 300 may be formed over seal rings (shown in FIG. 16) of each semiconductor die 400, 401 and 402, but the disclosure is not limited thereto.

Figure 6A:
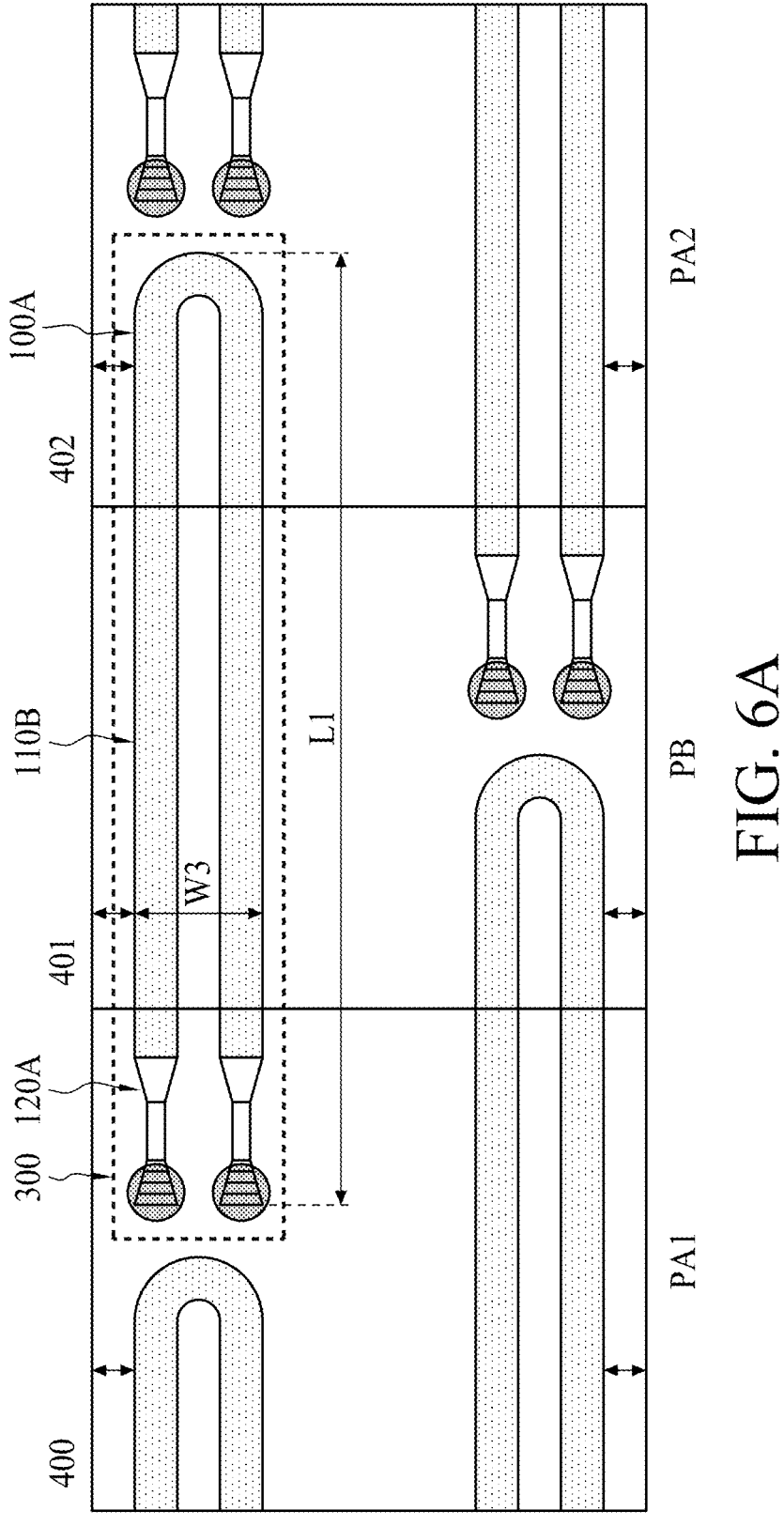
FIGS. 6A and 6B are schematic view of stitch structures formed by pattern combinations of FIG. 1 according to aspects of the present disclosure in one or more embodiments.

In some embodiments, the stitch structure 300 includes a pair of patterns PA1 and PA2 and a pattern PB disposed between the patterns PA1 and PA2. It should be noted that the patterns PA1 and PA2 are identical patterns. As shown in FIG. 6A, accordingly, the two GC segments 120A of the pattern PA1 and the U-shaped segment 100A of the pattern PA2, and the two long segments 110B of the pattern PB form a U-shaped stitch structure 300. Further, the stitch structure 300 crosses interfaces between the semiconductor dies 400, 401 and 402.

Figure 6B:
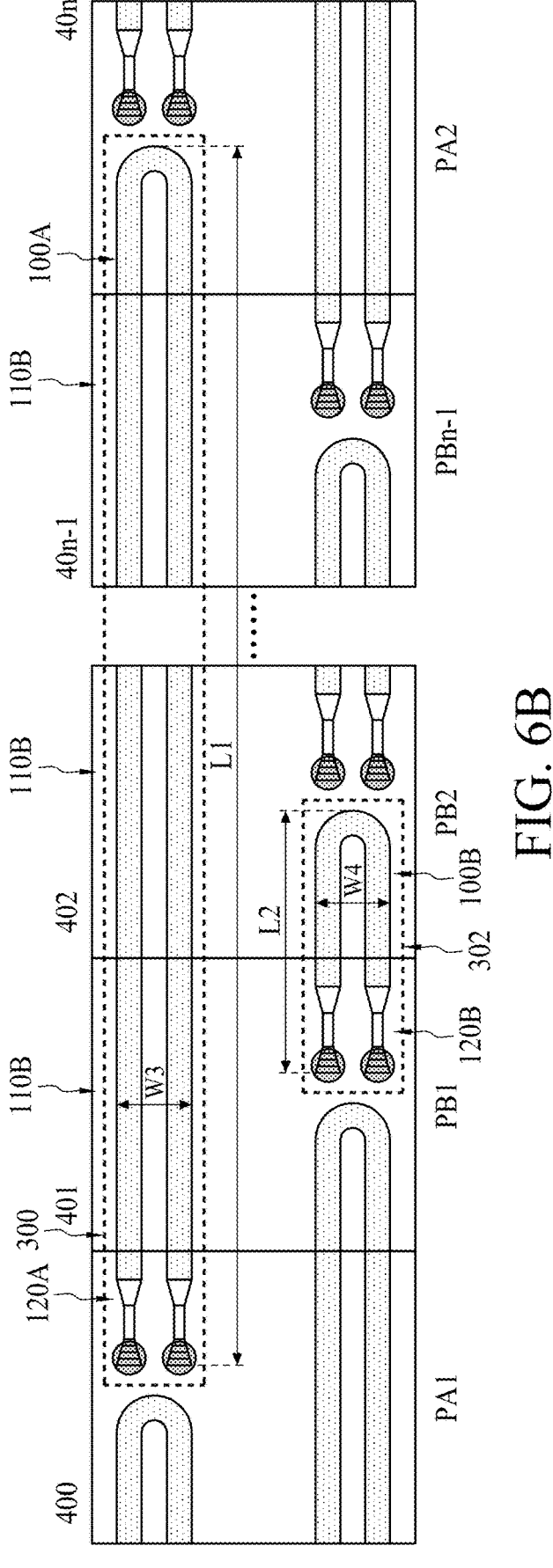

In some embodiments, by adding the pattern PB between the patterns PA1 and PA2, a length L1 of the stitch structure 300 can be adjusted. As shown in FIG. 6B, by arranging the pattern PA and the pattern PB in an order of PA-PB-PB . . . PB-PA, a stitch structure 300 can be formed in adjacent semiconductor dies 400, 401, 402 . . . 40$n$–1 and 40$n$. In some embodiments, the semiconductor dies 400, 401, 402 . . . , 40$n$–1 and 40$n$ are arranged to form a row. As mentioned above, the stitch structure 300 may be formed over seal rings of each semiconductor die 400, 401, 402, . . . 40$n$–1 and 40$n$, but the disclosure is not limited thereto. In some embodiments, the stitch structure 300 includes a pair of patterns PA1 and PA2 and a plurality of patterns PB1, PB2, . . . , and PBn–1 disposed between the patterns PA1 and PA2. It should be noted that the patterns PA1 and PA2 are identical patterns, and the patterns PB1. PB2, . . . , and PBn–1 are identical patterns. As shown in FIG. 6B, accordingly, the two GC segments 120A of the pattern PA1 and the U-shaped segment 100A of the pattern PA2, and the long segments 110B of the patterns PB1, PB2 and PBn–1 form a U-shaped stitch structure 300. Further, the stitch structure 300 crosses interfaces between the semiconductor dies 400, 401, 402, . . . 40$n$–1 and 40$n$.

Still referring to FIG. 6B, in some embodiments, at least one another stitch structure 302 is obtained under the stitch structure 300. The stitch structure 302 may be formed by two identical patterns PB1 and PB2. In some embodiments, the stitch structure 302 includes two GC segments of the pattern PB1 and the U-shaped segment of the pattern PB2. Further, the stitch structure 302 is a U-shaped stitch structure. As shown in FIG. 6B, the U-shaped stitch structure 302 crosses the interface between the two adjacent semiconductor dies 401 and 402.

The stitch structure 300 has a width W3 and the length L1, and the stitch structure 302 has a width W4 and a length L2. In some embodiments, the width W3 of the stitch structure 300 and the width W4 of the stitch structure 302 have a ratio, and the ratio is between 0.95 and 1.05. In some embodiments, The width W3 of the stitch structure 300 is equal to the width W4 of the stitch structure 302. The length L1 of the stitch structure 300 is greater than the length L2 of the stitch structure 302. In some embodiments, a stitch loss across the semiconductor dies 401, 402 and 403 can be obtained by detecting a waveguide loss of the stitch structure 300 that crosses the semiconductor dies 401, 402 and 403, as shown in FIG. 6A. In other embodiments, a stitch loss across all the semiconductor dies 400, 401, 402, . . . , 40$n$ can be obtained by detecting a waveguide loss of the stitch structure 300 that crosses the semiconductor dies 400, 401, 402, . . . , 40$n$, as shown in FIG. 6B. In such embodiments, a stitch loss across the two semiconductor dies 401 and 402 can be concurrently obtained by detecting a waveguide loss of the stitch structure 302. In conclusion, the stitch structure

302 helps to detect the stitch loss across two adjacent semiconductor dies 401 and 402, while the stitch structure 300 helps to detect the stitch loss across more than two semiconductor dies 400, 401, 402, . . . , 40$n$. Further, as shown in FIGS. 6A and 6B, it should be understood that by adding a quantity of the patterns PB between the patterns PA1 and PA2, various stitch losses can be obtained.

Figure 7:
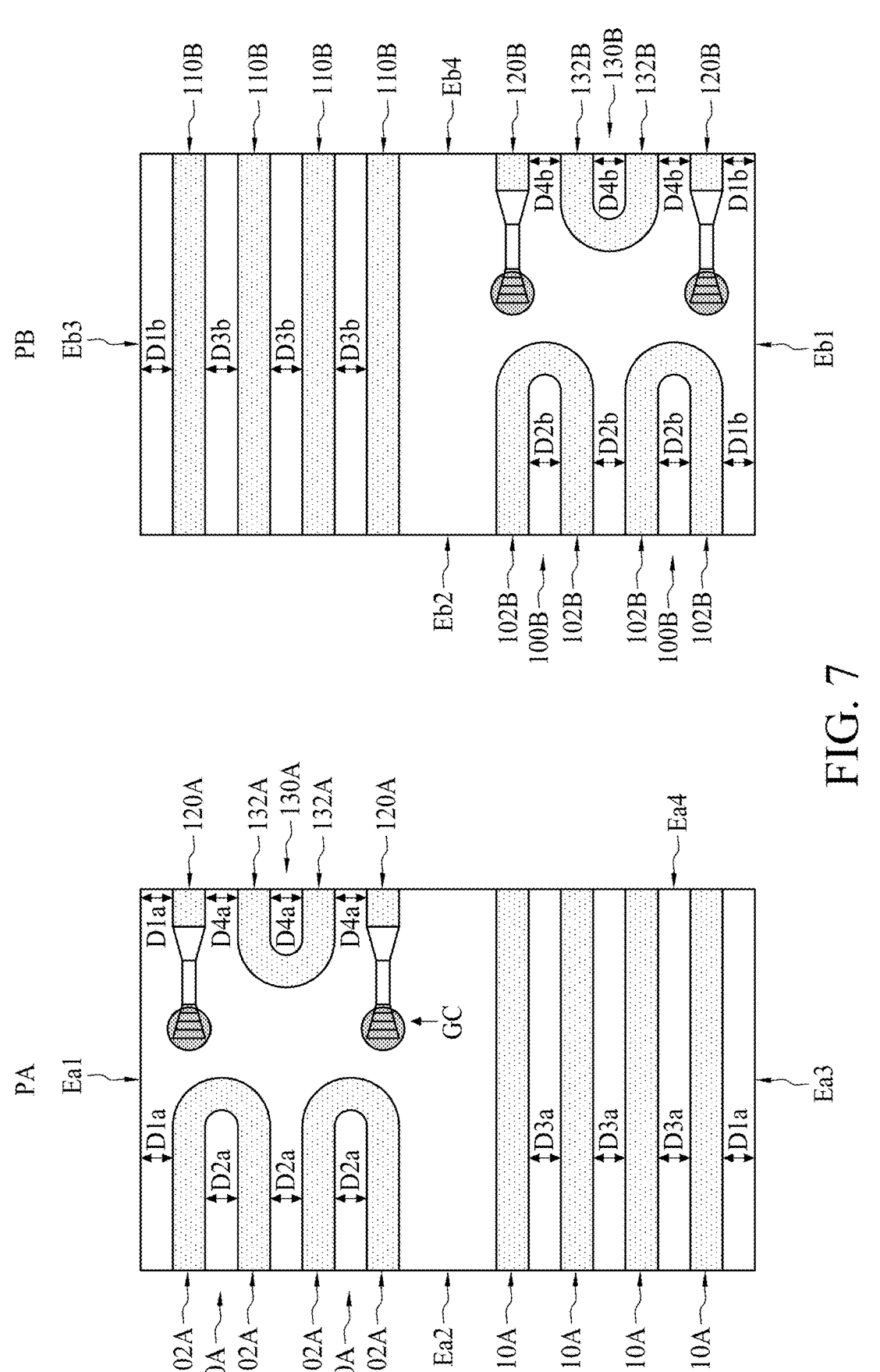
FIG. 7 is a schematic view of patterns according to aspects of the present disclosure in one or more embodiments.

Referring to FIG. 7, in some embodiments, the pattern PA and the pattern PB may have various segments and arrangements. For example, the pattern PA may have two U-shaped segments 100A, and the pattern PB may have two U-shaped segments 100B. The U-shaped segment 100A and the U-shaped segment 100B are identical. One of the U-shaped segments 100A is separated from an edge Ea1 of the pattern PA by a distance D1$a$, and one of the U-shaped segments 100B is separated from an edge Eb1 of the pattern PB by a distance D1$b$. The distance D1$a$ and the distance Db are equal. Each U-shaped segment 100A has two ends 102A adjacent to another edge Ea2 of the pattern PA, and each U-shaped segment 100B has two ends 102B adjacent to another edge Eb2 of the pattern PB. Further, the edge Ea1 of the pattern PA is perpendicular to the edge Ea2 of the pattern PA, and edge Eb1 of the pattern PB is perpendicular to the edge Eb2 of the pattern PB. The ends 102A of each U-shaped segment 100A are separated from each other by a distance D2$a$, and the two U-shaped segments 100A are separated from each other by the distance D2$a$. In addition, the ends 102B of each U-shaped segment 100B are separated from each other by a distance D2$b$, and the two U-shaped segments 100B are separated from each other by the distance D2$b$. The distance D2$a$ and the distance D2$b$ are equal. In some embodiments, the U-shaped segments 100A and the U-shaped segments 100B are waveguide patterns.

As shown in FIG. 7, the pattern PA may include a plurality of long segments 110A, and the pattern PB may include a plurality of long segments 110B. The long segments 110A and the long segments 110B are identical. One of the long segments 110A is separated from an edge Ea3 of the pattern PA by the distance D1$a$, and one of the long segments 110B is separated from an edge Eb3 of the pattern PB by the distance D1$b$. The long segments 110A extend from the edge Ea2 to an opposite edge Ea4 of the pattern PA; therefore, two ends of each long segment 110A are respectively adjacent to the edges Ea2 and Ea4 of the pattern PA. The long segments 110B extend from the edge Eb2 to an opposite edge Eb4 of the pattern PB; therefore, two ends of each long segment 110B are respectively adjacent to the edges Eb2 and Eb4 of the pattern PB. The adjacent long segments 110A are separated from each other by a distance D3$a$, and the adjacent long segments 110B are separated from each other by a distance D3$b$. Further, the distance D3$a$ and the distance D3$b$ are equal. In some embodiments, the long segments 110A and the long segments 110B are waveguide patterns.

Further, in some embodiments, the distance D2$a$ in the pattern PA and the distance D3$b$ in the pattern PB are equal. In some embodiments, the distance D3$a$ in the pattern PA and the distance D2$b$ in the pattern PB are equal.

As shown in FIG. 7, the pattern PA has two GC segments 120A, and the pattern PB has two GC segments 120B. The GC segments 120A and the GC segments 120B are identical. One of the GC segments 120A is separated from the edge Ea1 of the pattern PA by the distance D1$a$, and one of the GC segments 120B is separated from the edge Eb1 of the pattern PB by the distance D1$b$. An end of the GC segment 120A is adjacent to the edge Ea4 of the pattern PA, and an end of the GC segment 120B is adjacent to the edge Eb4 of the pattern PB.

In some embodiments, the pattern PA further includes another U-shaped segment 130A disposed between the two GC segments 120A, and the pattern PB further includes another U-shaped segment 130B disposed between the two GC segments 120B. A length of the U-shaped segment 130A is less than lengths of the U-shaped segments 100A, and a length of the U-shaped segment 130B is less than lengths of the U-shaped segments 100B. A quantity of the U-shaped segment 130A is less than a quantity of the U-shaped segments 100A, and a quantity of the U-shaped segment 130B is less than a quantity of the U-shaped segments 100B. In some embodiments, when the quantities of the U-shaped segments 100A and 100B are respectively m, the quantities of the U-shaped segments 130A and 130B are respectively m−1. As shown in FIG. 7, two ends 132A of the U-shaped segment 130A are adjacent to the edge Ea4 of the pattern PA, and two ends 132B of the U-shaped segment 130B are adjacent to the edge Eb4 of the pattern PB. The two GC segments 120A are respectively separated from the U-shaped segment 130A other by a distance D4a, and the two GC segments 120B are respectively separated from the U-shaped segment 130B by a distance D4b. The two ends 132A of the U-shaped segment 130A are separated from each other by the distance D4a, and the two ends 132B of the U-shaped segment 130B are separated from each other by the distance D4b. Further, the distance D4a and the distance D4b are equal.

Further, in some embodiments, the distance D4a in the pattern PA and the distance D3b in the pattern PB are equal. In some embodiments, the distance D4b in the pattern PB and the distance D3a in the pattern PA are equal.

Still referring to FIG. 7, the pattern PA and the pattern PB have identical segments but different arrangements. In the pattern PA, the U-shaped segments 100A and 130A and the GC segments 120A are disposed in an upper portion of the pattern PA, while the long segments 110A are disposed in a lower portion of the pattern PA. In contrast to the pattern PA, the long segments 110B are disposed in an upper portion of the pattern PB, while the U-shaped segments 100B and 130B and the GC segments 120B are disposed in a lower portion of the pattern PB.

Figure 8:
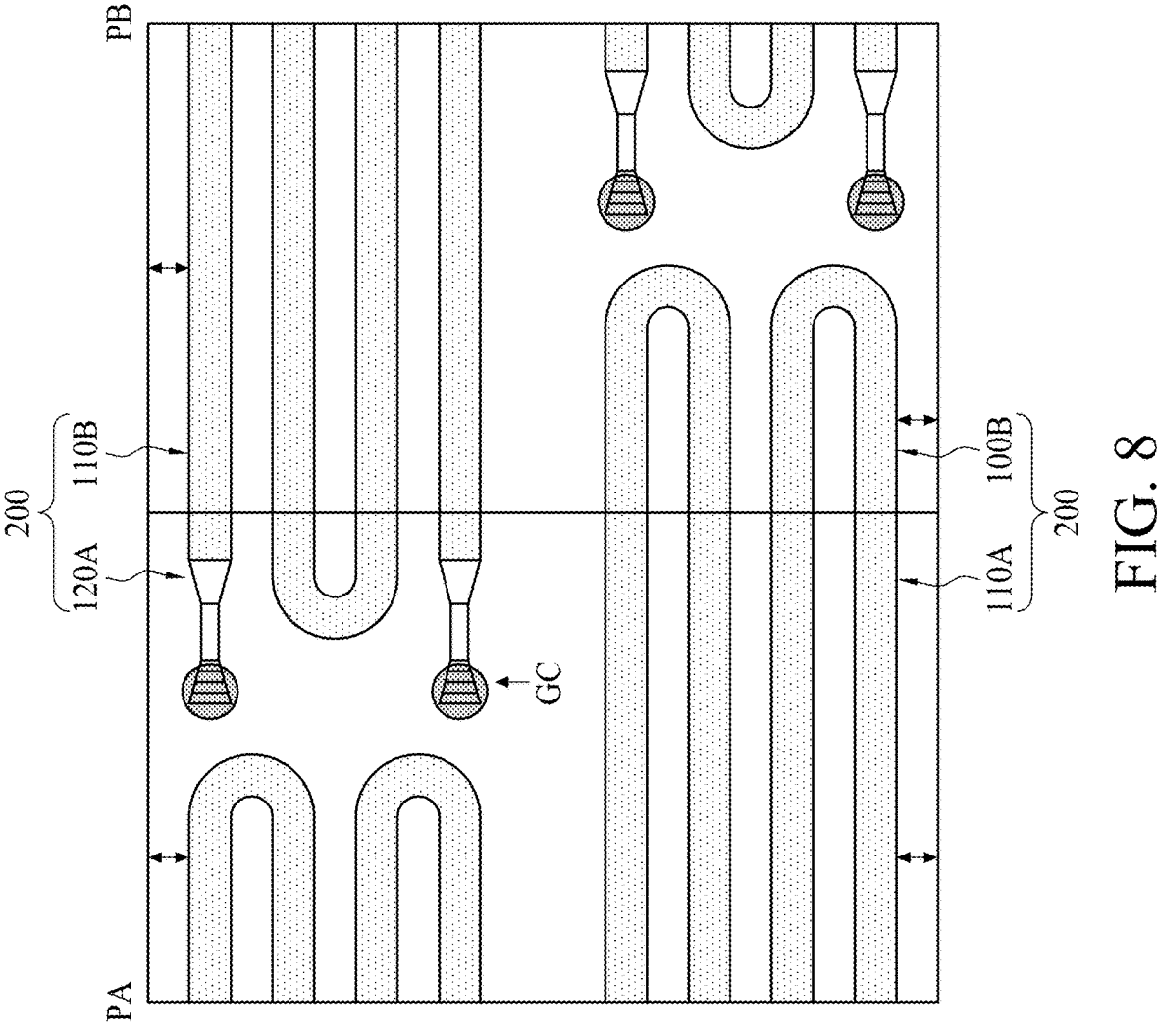
FIG. 8 is a schematic view of a stitch pattern according to aspects of the present disclosure in one or more embodiments.

The pattern PA and the pattern PB are used to form stitch patterns 200 in adjacent dies, as shown in FIG. 8. The stitch patterns 200 may have various configurations as shown in FIGS. 3A to 5D; therefore, details thereof are omitted for brevity. Further, the stitch pattern 200 is used to monitor a shift of the masks involved in the photolithography operations as mentioned above; therefore, details thereof are also omitted for brevity.

Figure 9A:
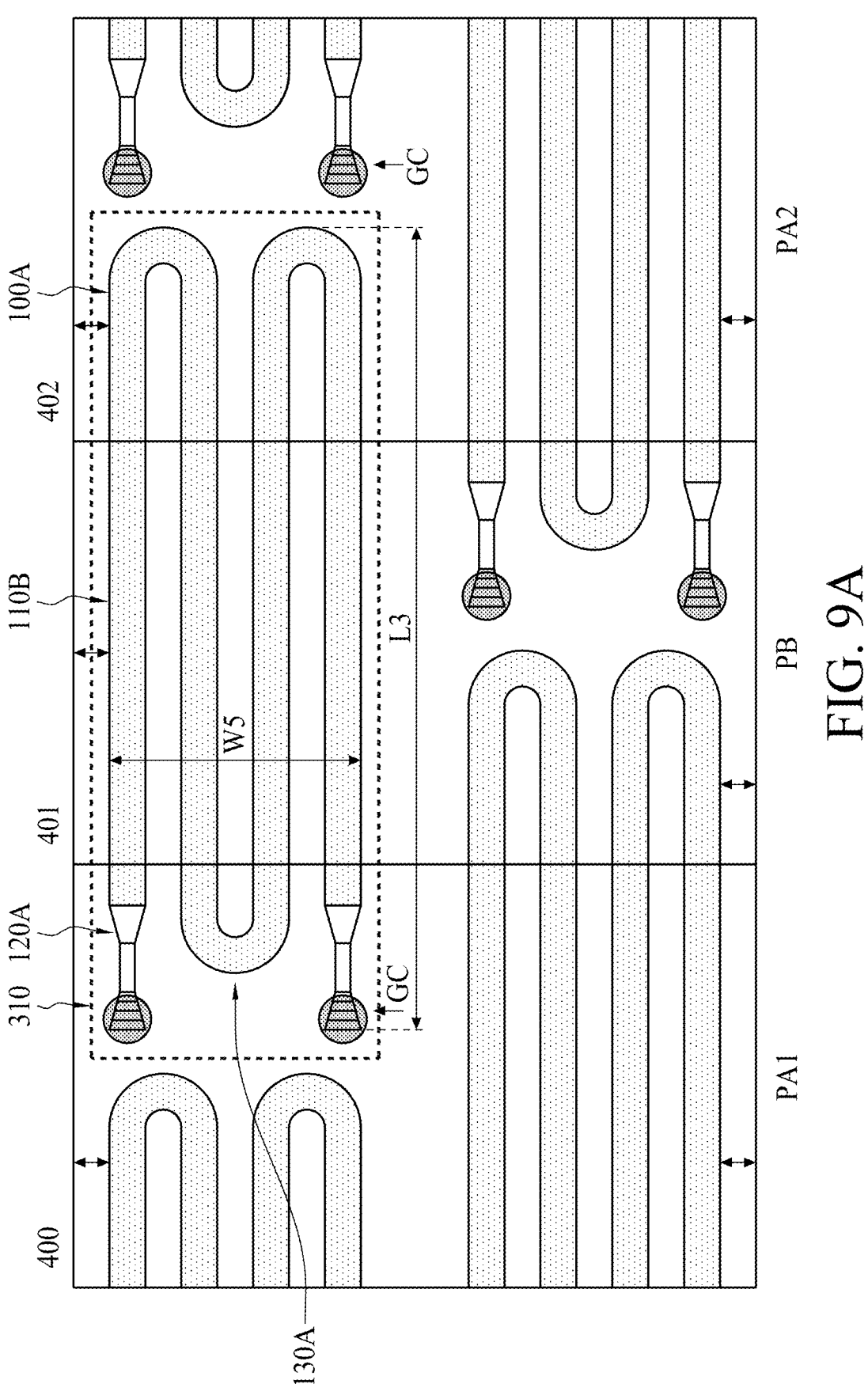
FIGS. 9A and 9B are schematic views of stitch structures formed by pattern combinations of FIG. 7 according to aspects of the present disclosure in one or more embodiments.

Combinations of the pattern PA and the pattern PB are used to form stitch structures according to different embodiments. For example, referring to FIG. 9A, by arranging the pattern PA and the pattern PB in an order of PA-PB-PA, a stitch structure 310 can be formed in adjacent semiconductor dies 400, 401 and 402. In some embodiments, the semiconductor dies 400, 401 and 402 are arranged to form a row. In some embodiments, the stitch structure 310 is a semiconductor waveguide, such as a silicon nitride waveguide. In some embodiments, the stitch structure 310 is referred to as test keys. In some embodiments, the stitch structure 310 may be formed over seal rings (shown in FIG. 14) of each semiconductor die 400, 401 and 402, but the disclosure is not limited thereto. In some embodiments, the stitch structure 310 includes a pair of patterns PA1 and PA2 and a pattern PB1 disposed between the patterns PA1 and PA2. It should be noted that the patterns PA1 and PA2 are identical patterns. As shown in FIG. 9A, accordingly, the two GC segments 120A and the U-shaped segment 130A of the pattern PA1, the U-shaped segments 100A of the pattern PA2, and the long segments 110B of the pattern PB form a stitch structure 310 having a serpentine shape. Further, the stitch structure 310 crosses interfaces between the semiconductor dies 400, 401 and 402.

Figure 9B:
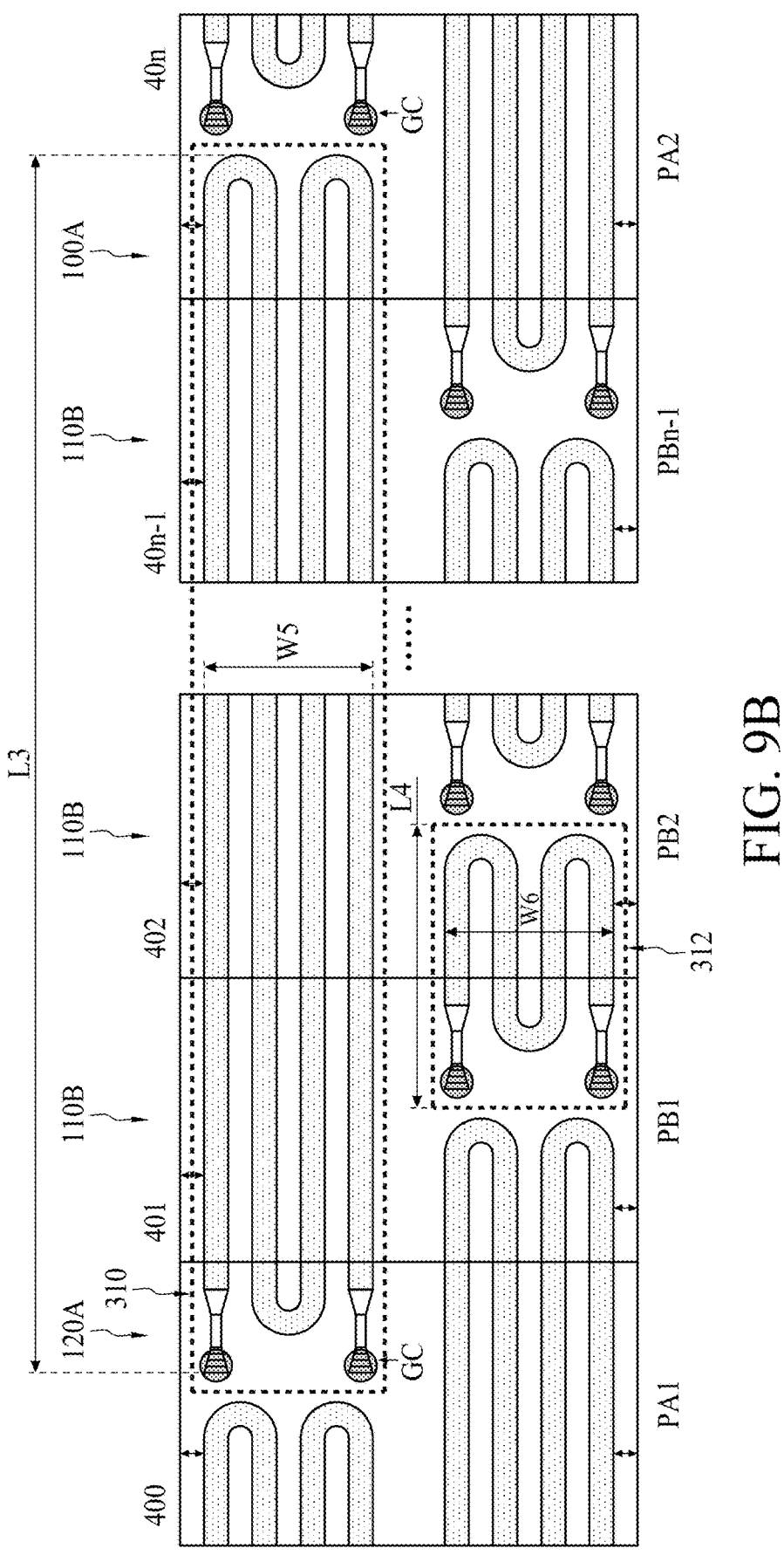

In some embodiments, by adding the pattern PB between the patterns PA1 and PA2, a length L3 of the stitch structure 310 can be adjusted. As shown in FIG. 9B, by arranging the pattern PA and the pattern PB in an order of PA-PB-PB, . . . . . PB-PA, a stitch structure 310 can be formed in adjacent semiconductor dies 400, 401, 402, . . . , 40n−1 and 40n. In some embodiments, the semiconductor dies 400, 401, 402, . . . , 40n−1 and 40n are arranged to form a row. In some embodiments, the stitch structure 310 may be formed over seal rings (not shown) of each semiconductor die 400, 401, 402, . . . 40n−1 and 40n, but the disclosure is not limited thereto. In some embodiments, the stitch structure 310 includes the pair of patterns PA1 and PA2 and a plurality of pattern PB1, PB2, . . . . PBn−1 disposed between the patterns PA1 and PA2. It should be noted that the patterns PA1 and PA2 are identical patterns, and the patterns PB1, PB2, . . . . PBn−1 are identical patterns. As shown in FIG. 9B, accordingly, the two GC segments 120A and the U-shaped segment 130A of the pattern PA1, the U-shaped segment 100A of the pattern PA2, and the long segments 110B of the patterns PB1, PB2, . . . , PBn−1 form a serpentine stitch structure 310. Further, the stitch structure 310 crosses interfaces between the semiconductor dies 400, 401, 402, . . . 40n−1 and 40n.

Still referring to FIG. 9B, in some embodiments, at least one other stitch structure 312 is obtained under the stitch structure 310. The stitch structure 312 may be formed by the two identical patterns PB1 and PB2. In some embodiments, the stitch structure 312 includes the two GC segments 120B and the U-shaped segment 130B of the pattern PB1, and the U-shaped segments 100B of the pattern PB2. Further, the stitch structure 312 has a serpentine shape. As shown in FIG. 9B, the stitch structure 312 crosses the interface between the two adjacent semiconductor dies 401 and 402.

The stitch structure 310 has a width W5 and the length L3, and the stitch structure 312 has a width W6 and a length L4. In some embodiments, the width W5 of the stitch structure 310 and the width W6 of the stitch structure 301 have a ratio, and the ratio is between 0.95 and 1.05. The width W5 of the stitch structure 310 is equal to the width W6 of the stitch structure 312. The length L3 of the stitch structure 310 is greater than the length L4 of the stitch structure 312. In some embodiments, a stitch loss across the semiconductor dies 401, 402 and 403 can be obtained by detecting a waveguide loss of the stitch structure 310 that passes through the semiconductor dies 401, 402 and 403, as shown in FIG. 9A. In other embodiments, a stitch loss across all the semiconductor dies 400, 401, 402, . . . , 40n can be obtained by detecting a waveguide loss of the stitch structure 310 that passes through the semiconductor dies 400, 401, 402, . . . , 40n, as shown in FIG. 9B. In such embodiments, a stitch loss across the two semiconductor dies 401 and 402 can be obtained by detecting a waveguide loss of the stitch structure 312. In conclusion, the stitch structure 312 helps to detect the stitch loss across the two adjacent semiconductor dies 401 and 402, while the stitch structure 310 helps to detect the stitch loss across the more than two semiconductor dies 400, 401, 402, . . . , 40n. Further, as shown in FIGS. 9A and 9B, it should be understood that by adding a quantity of the patterns PB between the patterns PA1 and PA2, various stitch loss can be obtained.

Further, the stitch loss can be amplified because there are more segments in the stitch structures 310 and 312.

Figure 10A:
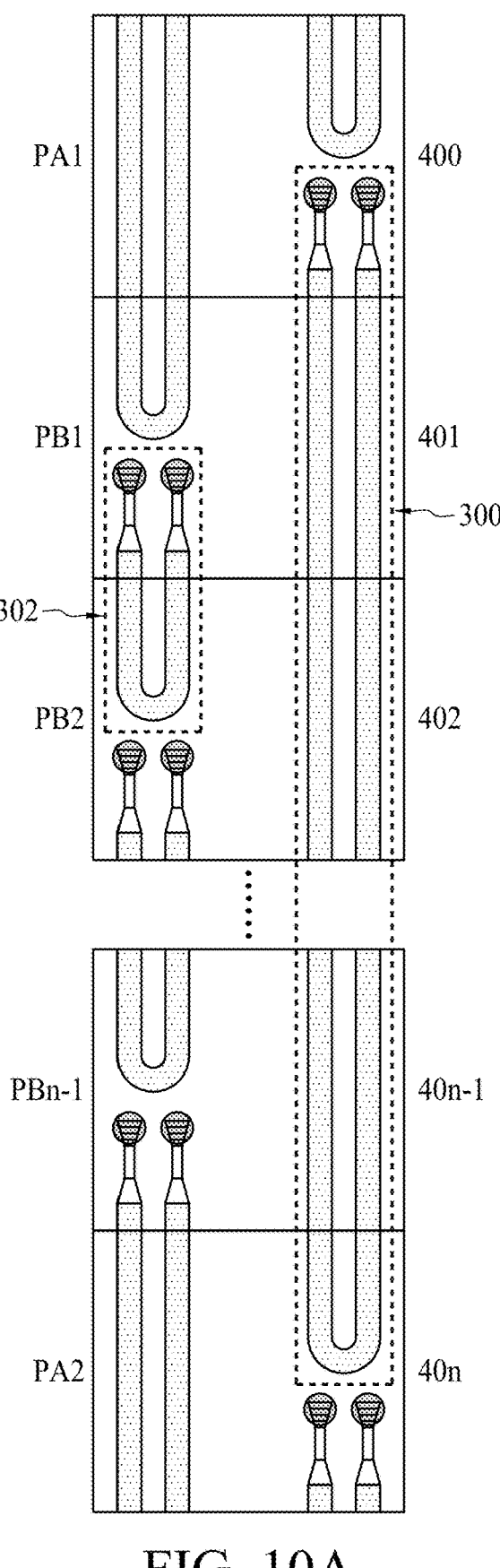
FIGS. 10A and 10B are schematic views of stitch structures according to aspects of the present disclosure in one or more embodiments.
Figure 10B:
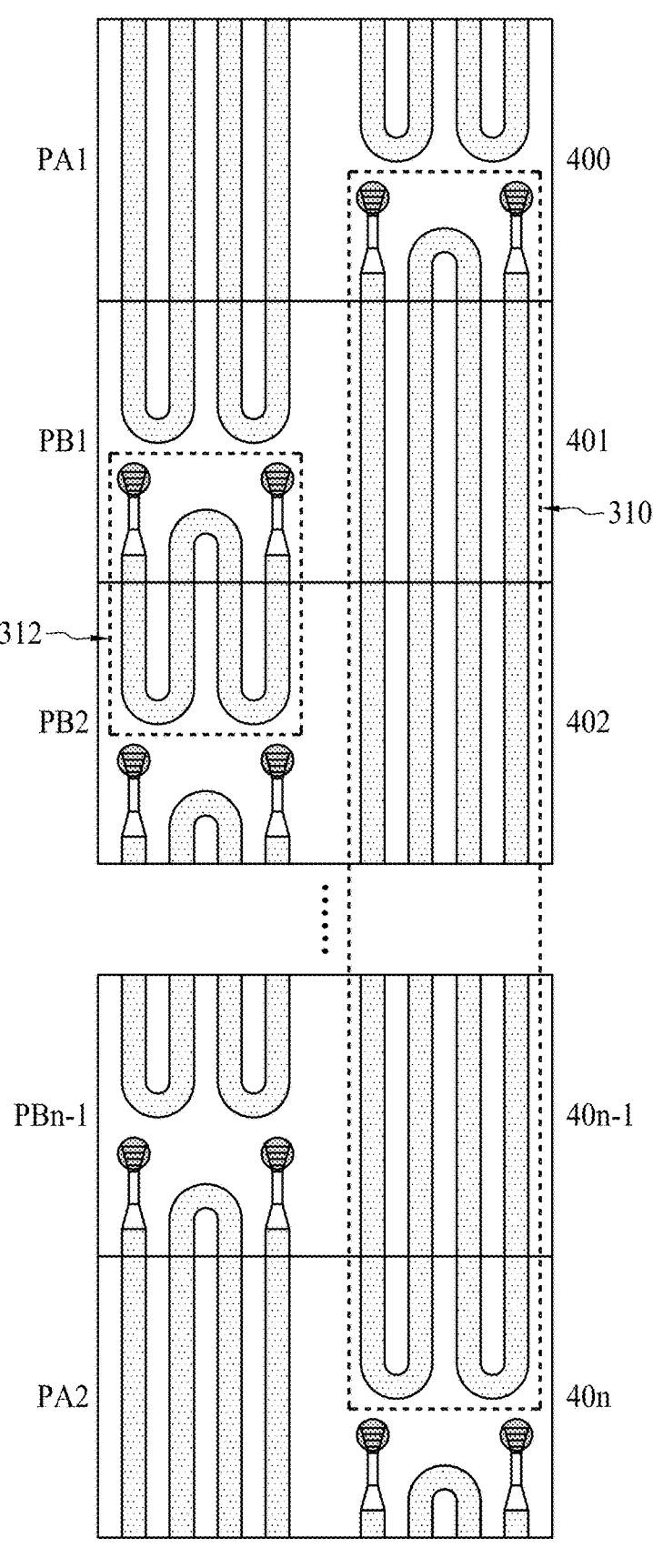

Referring to FIGS. 10A and 10B, in some embodiments, the patterns PA and PB can be formed in semiconductor dies arranged to form a column, such that stitch loss in a different direction can be obtained.

Figure 11:
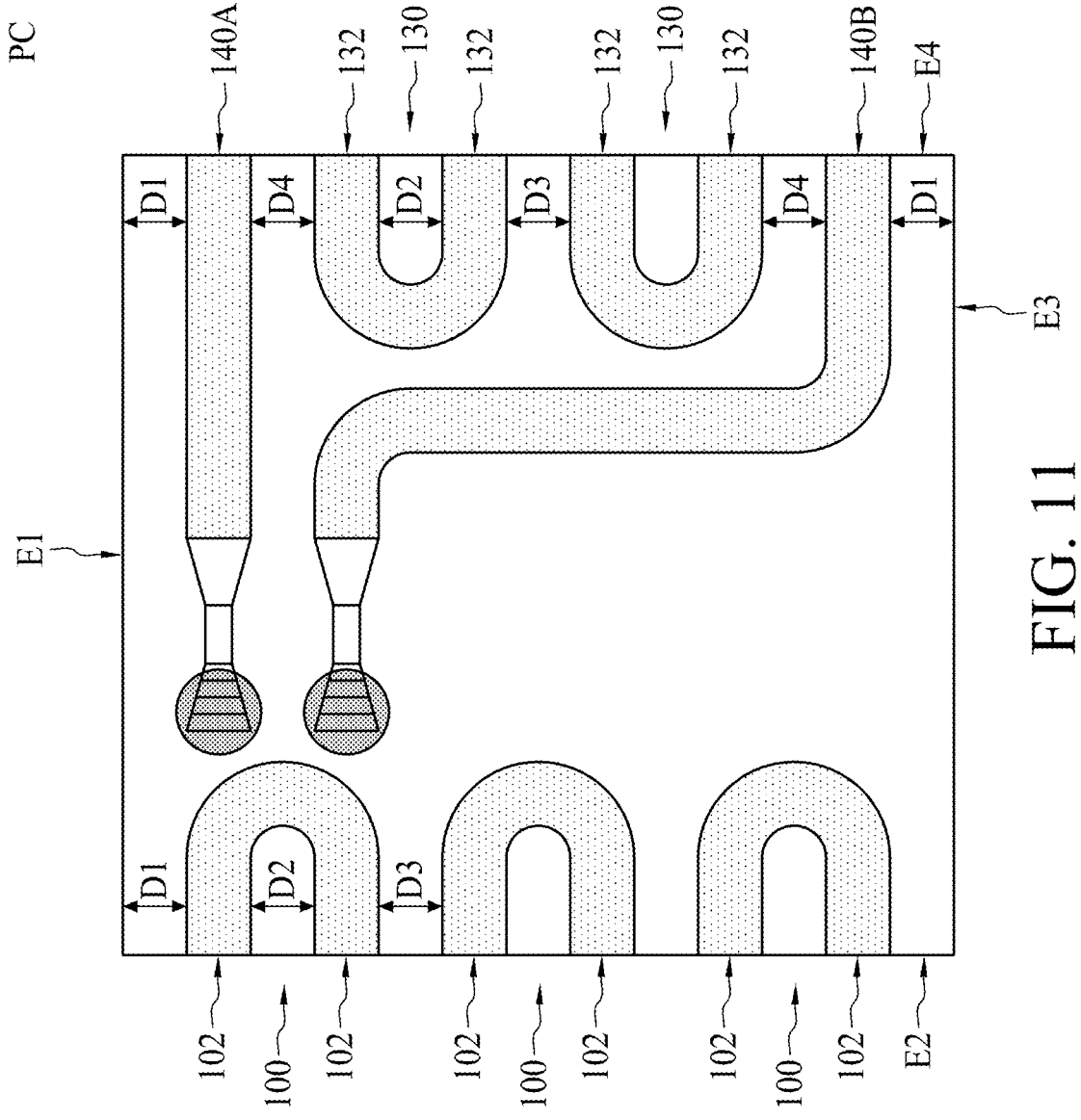
FIG. 11 is a schematic view of a pattern according to aspects of the present disclosure in one or more embodiments.

Please refer to FIG. 11, which is a schematic view of a pattern according to aspects of the present disclosure in one or more embodiments. In some embodiments, a pattern PC is provided. The pattern PC has a plurality of U-shaped segments 100 and 130, and two GC segments 140A and 140B. The U-shaped segments 100 are identical, and the U-shaped segments 130 are identical. In some embodiments, the U-shaped segments 100 and the U-shaped segments 130 are identical. One of the U-shaped segments 100 is separated from an edge E1 of the pattern PC by a distance D1. Each of the U-shaped segments 100 has two ends 102 adjacent to another edge E2 of the pattern PC, and each of the U-shaped segments 130 has two ends 132 adjacent to another edge E4 of the pattern PC. Further, the edge E1 of the pattern PC is perpendicular to the edge E2 and the edge E4 of the pattern PC. The two ends 102 of each U-shaped segment 100 are separated from each other by a distance D2, and the two ends 132 of each U-shaped segment 130 are separated from each other by the distance D2. Further, the U-shaped segments 100 are separated from each other by a distance D3, and the U-shaped segments 130 are separated from each other by the distance D3. In some embodiments, the distance D2 and the distance D3 are equal. In some embodiments, the U-shaped segments 100 and the U-shaped segments 130 are waveguide patterns.

In some embodiments, a length of the U-shaped segment 100 is equal to a length of the U-shaped segment 130, but the disclosure is not limited thereto. A quantity of the U-shaped segments 130 is less than a quantity of the U-shaped segments 100. In some embodiments, when the quantity of the U-shaped segments 100 is m, the quantity of the U-shaped segments 130 is m−1.

As shown in FIG. 11, the pattern PC further has two GC segments 140A and 140B, and the U-shaped segments 130 are disposed between the two GC segments 140A and 140B. The GC segment 140A is separated from the edge E1 of the pattern PC by the distance D1, and the GC segment 140B is separated from an edge E3 by the distance D1. An end of each GC segment 140A and 140B is adjacent to the edge E4 of the pattern PC. The GC segment 140A is separated from one of the U-shaped segments 130 by a distance D4, and the GC segment 140B is separated from one of the U-shaped segments 130 by the distance D4. In some embodiments, the GC segments 140A and 140B have different configurations.

Further, in some embodiments, the distances D2, D3 and D4 in the pattern PC are equal.

Figure 12:
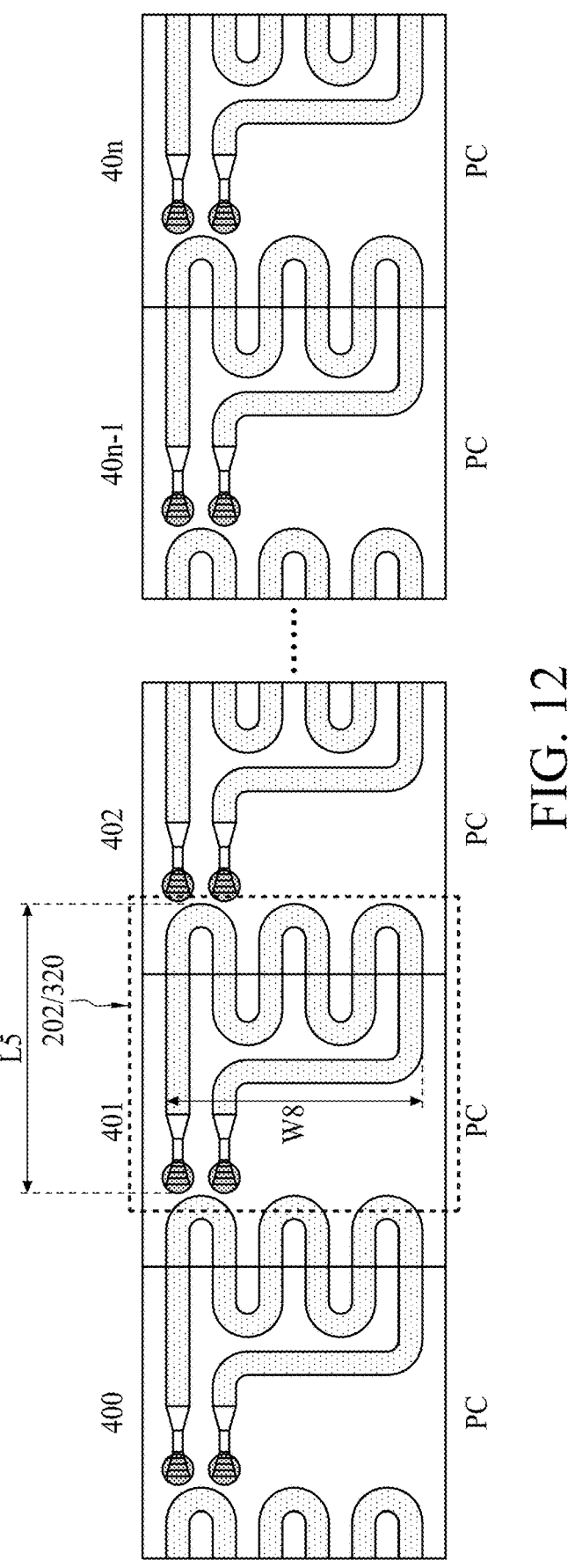
FIGS. 12 and 13 are schematic views of stitch structures formed by pattern combinations of FIG. 11 according to aspects of the present disclosure in one or more embodiments.

Referring to FIG. 12, the pattern PC can be used to form stitch patterns 202 in adjacent dies. The stitch patterns 202 may have various configurations that can be used to monitor a shift of the masks involved in the photolithography operations as mentioned above; therefore, details thereof are omitted for brevity.

Figure 13:
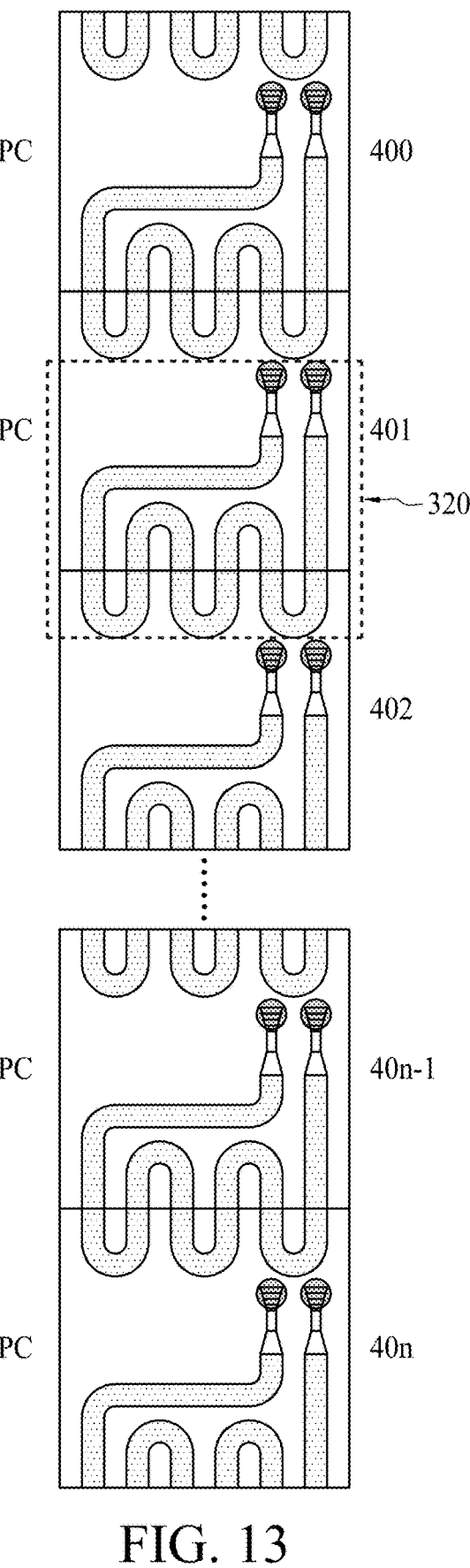

Combinations of the patterns PC are used to form stitch structures according to different embodiments. For example, referring to FIG. 12, by repeatedly arranging the patterns PC, a stitch structure 320 can be formed in adjacent semiconductor dies 400, 401, 402 . . . , 40n−1 and 40n. In some embodiments, the semiconductor dies 400, 401, 402, 40n−1 and 40n are arranged to form a row. In some embodiments, the stitch structure 320 is a semiconductor waveguide, such as a silicon nitride waveguide. In some embodiments, the stitch structure 320 is referred to as test keys. In some embodiments, the stitch structure 320 may be formed over seal rings (shown in FIG. 14) of each semiconductor die 400, 401, 402 . . . , 40n−1 and 40n, but the disclosure is not limited thereto. In some embodiments, the two adjacent patterns PC form a stitch structure 320, and thus a plurality of identical stitch structures 320 may be obtained, as shown in FIG. 12. Referring to FIG. 13, in some embodiments, the pattern PC can be formed in semiconductor dies arranged to form a column.

Figure 14:
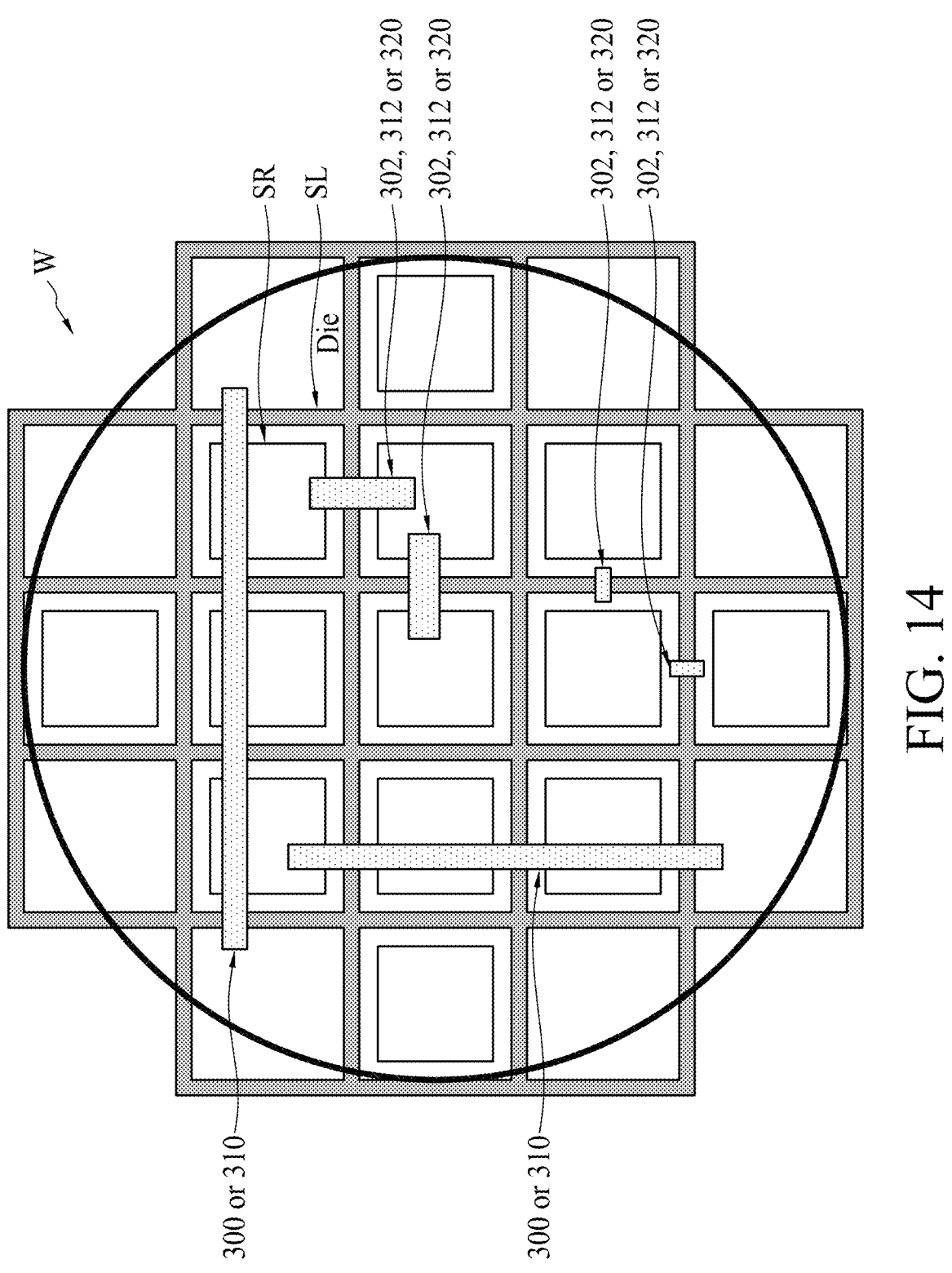
FIG. 14 is a schematic drawing of a wafer including stitch structures according to aspects of the present disclosure in one or more embodiments.

The stitch structures 300, 302, 310, 312 and 320 can be disposed in various locations over a wafer. Referring to FIG. 14, in some embodiments, the stitch structure 300 and/or 310 can be disposed over semiconductor dies arranged to form a row or a column. The stitch structures 300 and/or 310 may overlap seal rings SR in each semiconductor die and scribe lines SL between the semiconductor dies. In some embodiments, the stitch structures 302, 312 and/or 320 may be disposed over two adjacent semiconductor dies. The stitch structures 302, 312 and/or 320 may overlap the seal rings SR and the scribe line SL. In some alternative embodiments, the stitch structures 302, 312 and/or 320 may overlap the scribe line SL between the adjacent two semiconductor dies, but the stitch structures 302, 312 and/or 320 may be offset from the seal rings SR.

Figure 15:
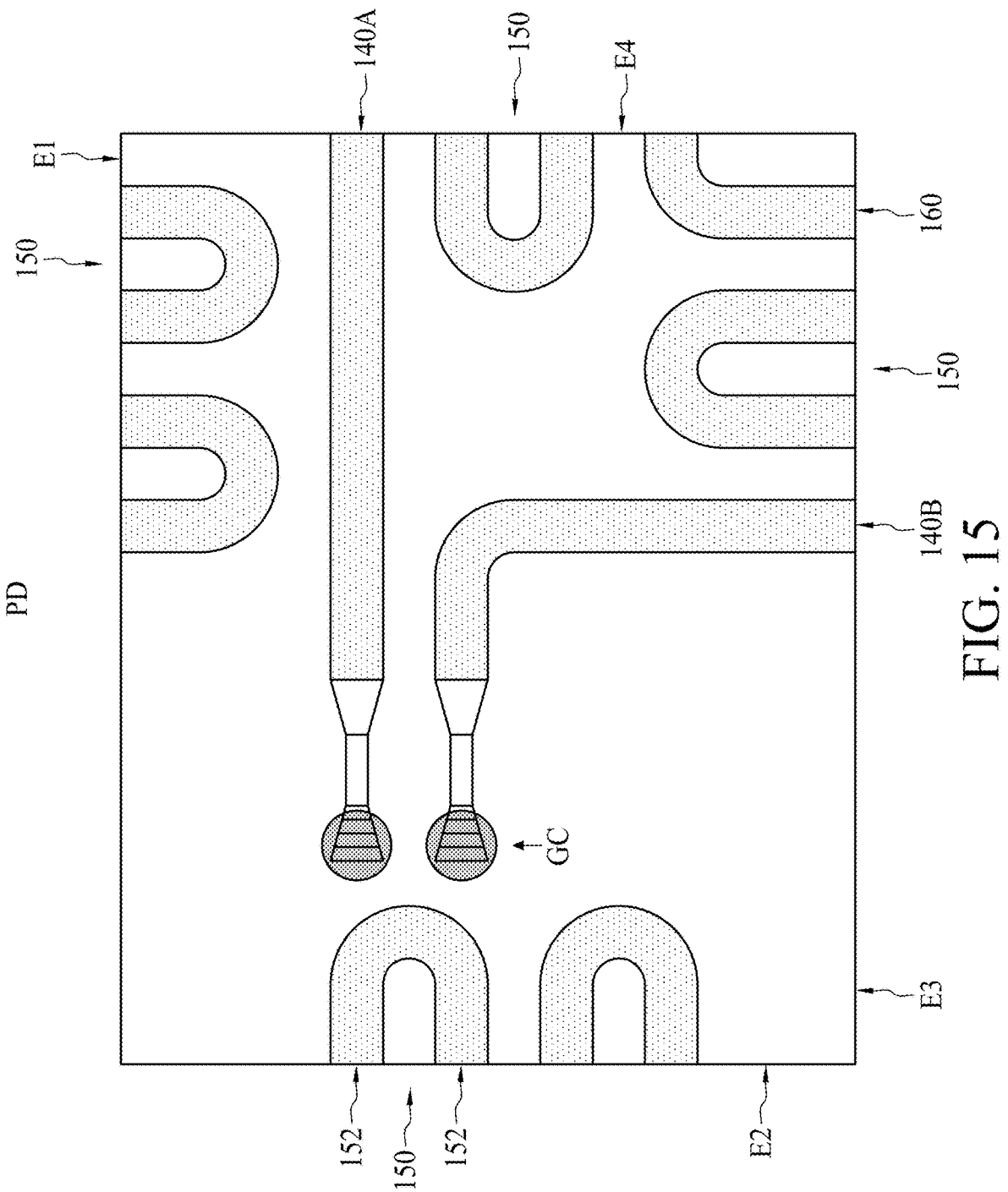
FIG. 15 is a schematic view of a pattern according to aspects of the present disclosure in one or more embodiments.

Please refer to FIG. 15, which is a schematic view of a pattern according to aspects of the present disclosure in one or more embodiments. In some embodiments, a pattern PD is provided. The pattern PD has a plurality of U-shaped segments 150, two GC segments 140A and 140B, and an L-shaped segment 160. Each of the U-shaped segments 150 has two ends 152. In some embodiments, the two ends of the U-shaped segment 150 are adjacent to an edge E1, an edge E2, an edge E3 or an edge E4 of the pattern PD, as shown in FIG. 15. In some embodiments, the pattern PD has two GC segments 140A and 140B. An end of the GC segment 140A is adjacent to the edge E4, and an end of the GC segment 140B is adjacent to the edge E3. Further, the GC segments 140A and 140B have different configurations. In some embodiments, a width of the U-shaped segments 150 and a width of the GC segments 140A and 140B are equal.

Figure 16:
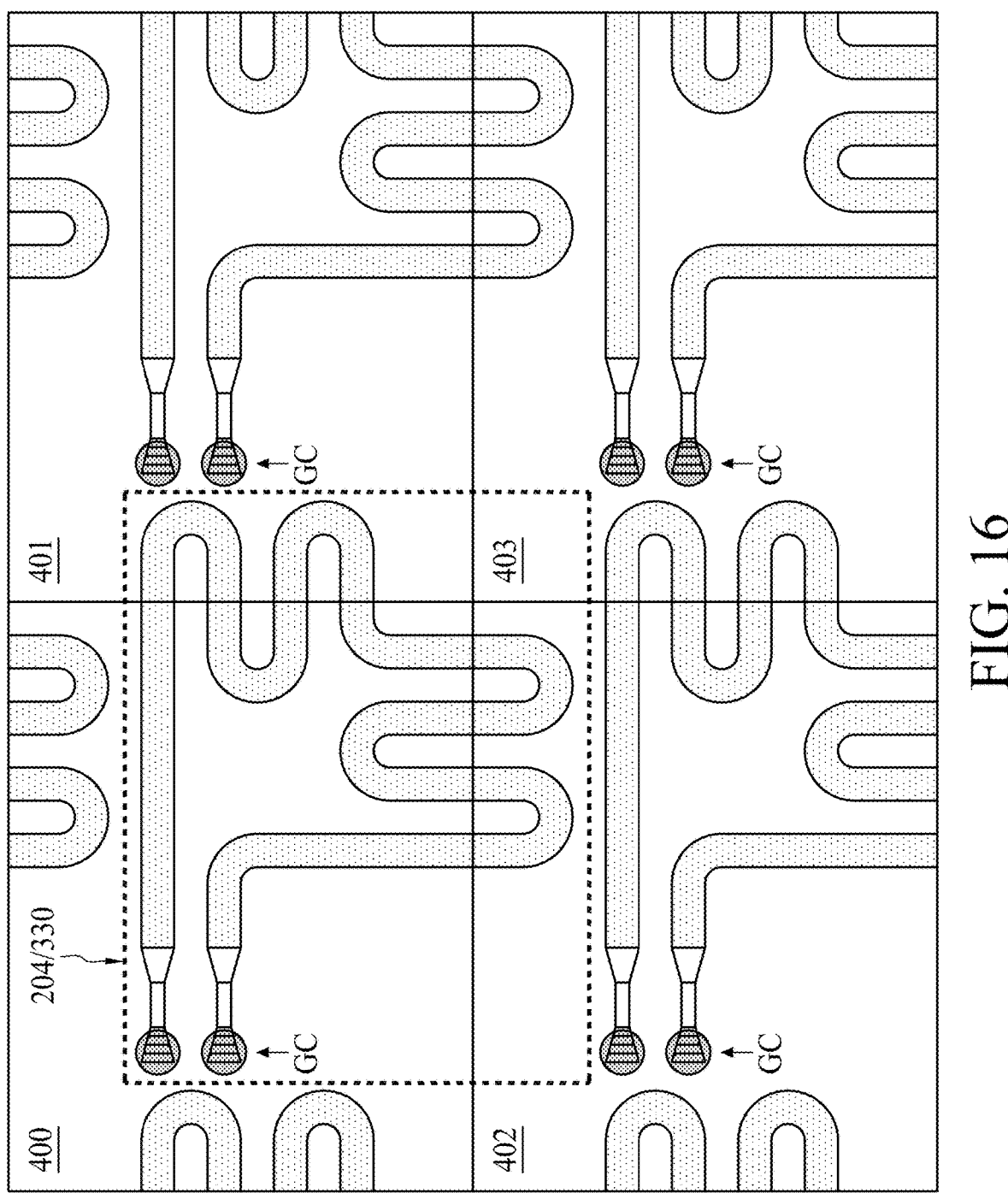
FIG. 16 is a schematic view of stitch structures formed by pattern combinations of FIG. 15 according to aspects of the present disclosure in one or more embodiments.

Referring to FIG. 16, the pattern PD can be used to form stitch structure 204. In some embodiments, four patterns PD are arranged to form a column-and-row array, thereby obtaining the stitch pattern 204, as shown in FIG. 16. The stitch pattern 204 formed by the patterns PD can be used to monitor a horizontal shift and a vertical shift of the masks involved in the photolithography operations as mentioned above; therefore, details thereof are omitted for brevity.

Combinations of the patterns PD are used to form stitch structures according to different embodiments. For example, referring to FIG. 16, by periodically forming the patterns PD, a stitch structure 330 can be formed in semiconductor dies 400, 401, 402 and 403 that are arranged in a column-and-row array. In some embodiments, the stitch structure 330 is a semiconductor waveguide, such as a silicon nitride waveguide. In some embodiments, the stitch structure 330 is referred to as test keys.

Figure 17:
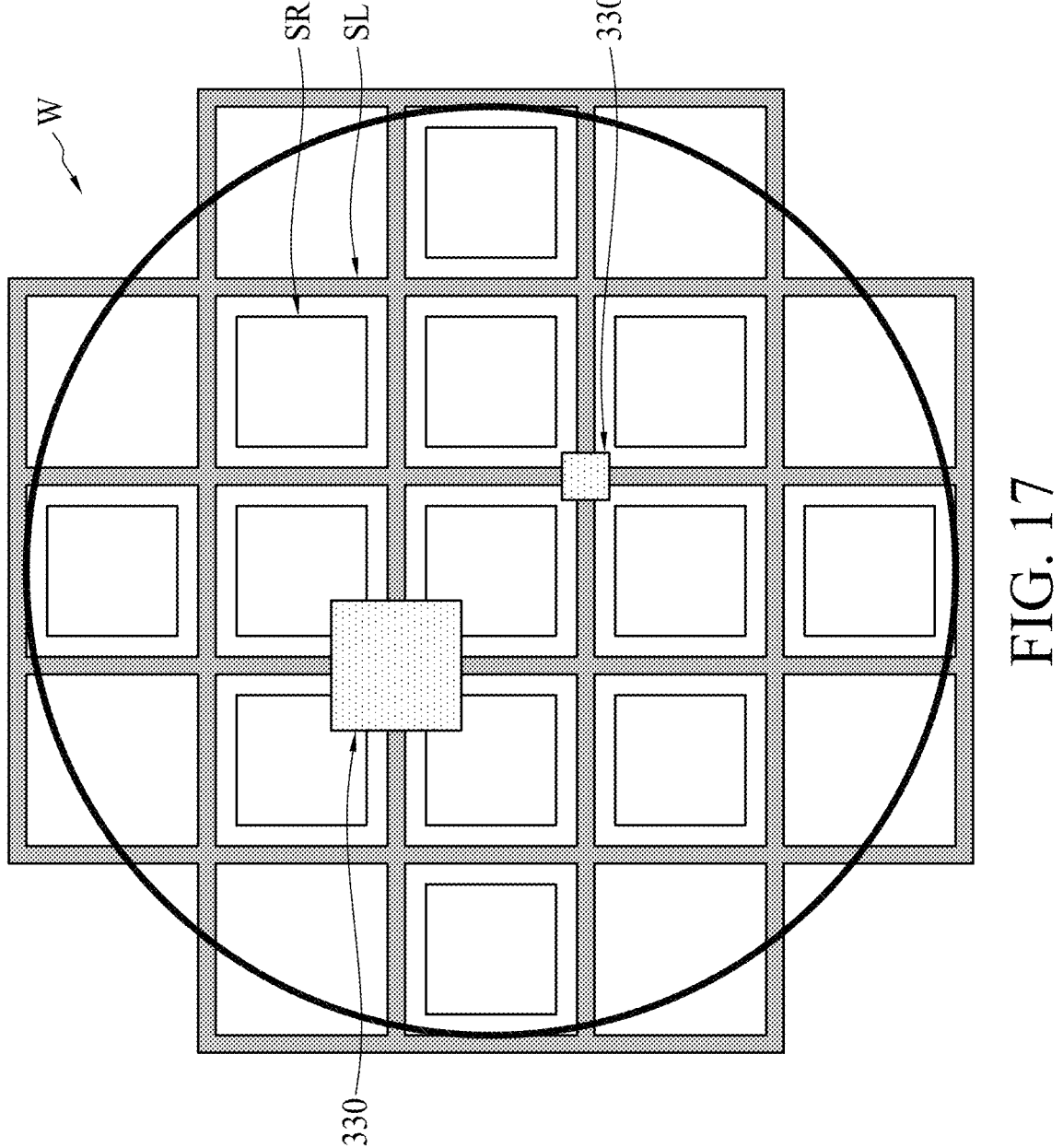
FIG. 17 is a schematic drawing of a wafer including stitch structures according to aspects of the present disclosure in one or more embodiments.

The stitch structure 330 can be disposed in various locations over a wafer. Referring to FIG. 17, in some embodiments, the stitch structure 330 can be disposed to occupy corners of four semiconductor dies. In some embodiments, the stitch structure 330 may overlap seal rings SR in each semiconductor die and scribe lines SL between the semiconductor dies. In some alternative embodiments, the stitch structure 330 may overlap the scribe lines SL between the four semiconductor dies, but the stitch structure 330 may be offset from the seal rings SR.

As mentioned above, the stitch structures 300, 302, 310, 312, 320 and 330 are waveguide structures. In some embodiments, the waveguide structures transport optical signals. In some embodiments, the waveguide structures operate on wavelength bands such as C-band (1530 nm≤λ≤1565 nm) and O-band (1260 nm≤λ≤1360 nm), but the disclosure is not limited thereto.

As mentioned above, the stitch structures 300, 302, 310, 312, 320 and 330 are used to monitor a stitch loss when an optical signal propagates along a waveguide. In some embodiments, a waveguide crossing more dies will incur more stitch loss. The stitch structures 300, 302, 310, 312, 320 and 330 are used to monitor such stitch loss. According to a result of the monitoring, when the stitch loss is determined, countermeasures can be taken. For example, when a stitch loss is greater than a tolerance value, an additional electrical circuit may be used to pump and amplify the optical signal.

Figure 18:
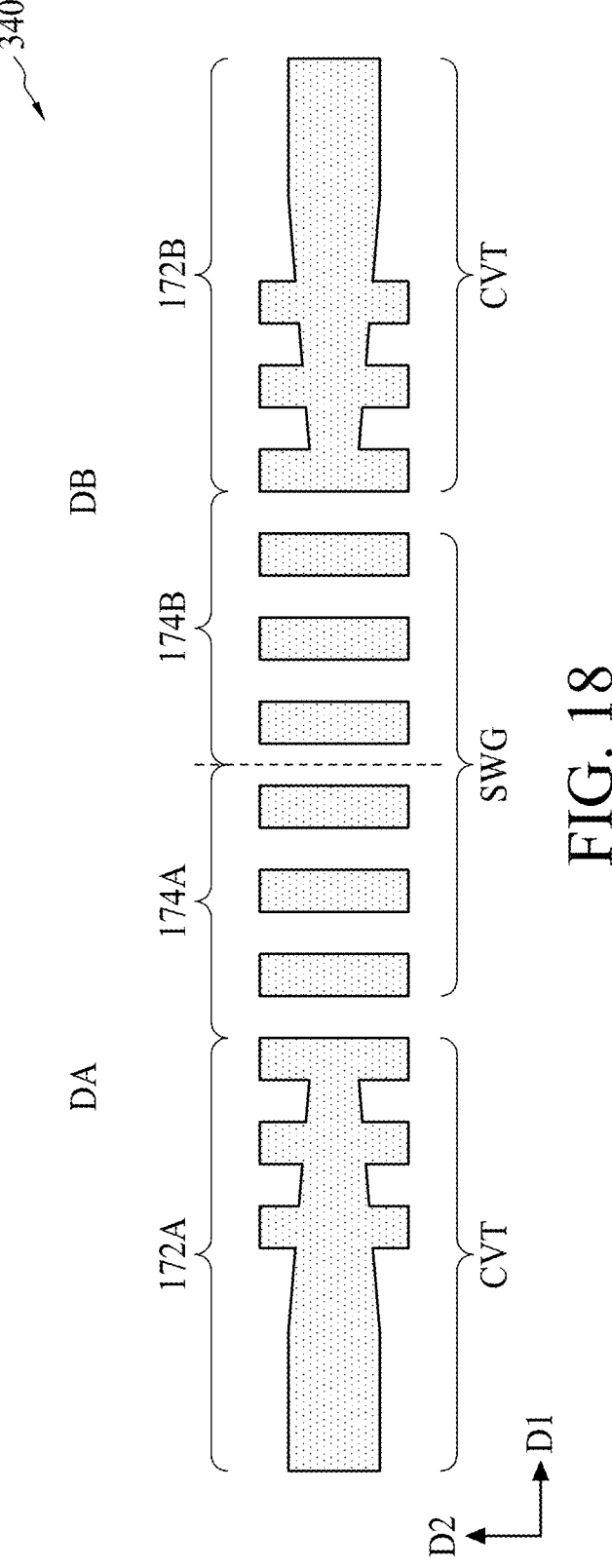
FIG. 18 is a schematic view of stitch structures according to aspects of the present disclosure in one or more embodiments.

In some embodiments, the stitch structure can be used in applications more than test keys. Referring to FIG. 18, in some embodiments, a stitch structure 340 functioning as a waveguide such that the optical signals propagate along the waveguide is provided. The stitch structure 340 may have segments disposed in different dies DA and DB, respectively. As shown in FIG. 18, the stitch structure 340 may have a first segment 172A and second segments 174B disposed in the die DA, and a third segment 172B and fourth segments 174B disposed in the die Db. The first segment 172A and the fourth segment 172B are identical and line symmetrical about a boundary of the die DA and the die DB. The second segments 174A and the third segments 174B are identical and line symmetrical about the boundary of the die DA and the die DB. Further, the second and third segments 174A and 174B are disposed between the first and fourth segments 172A and 172B. In some embodiments, the first and fourth segments 172A and 172B function as converters CVT, while the second and third segments 174A and 174B work together to function as a sub wavelength grating (SWG) waveguide. In such embodiments, the stitch structure 340 is band pass filter for O and C band ranges. Additionally, due to the arrangements of the second and third segments 174A and 174B, impact from mask shift may be mitigated.

Figure 19:
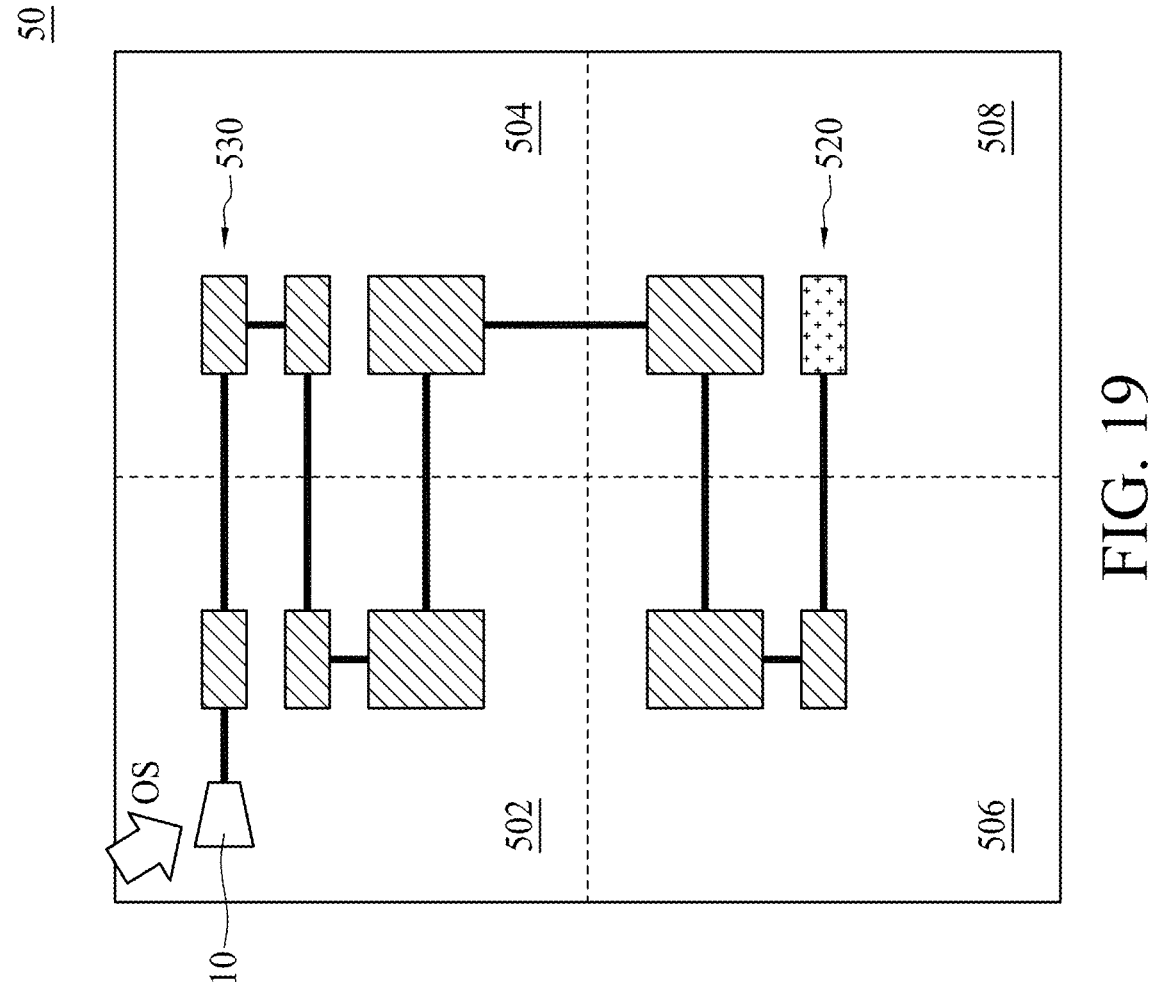
FIG. 19 is a schematic view of stitch structures in a system according to aspects of the present disclosure in one or more embodiments.

Please refer to FIG. 19, which is a schematic drawing illustrates a system including photonic integrated circuits. In some embodiments, the system 50 includes a plurality of dies, 502, 504, 506 and 508. In some embodiments, at least a grating coupler 510 is disposed in one of the dies 502 of the system 50. The grating coupler 510 is used to receive optical signal OS. The system 50 further includes a photo-diode 520 disposed in one of the dies 508. Further, the system 50 includes a plurality of devices 530 that transmit the optical OS from the grating coupler 510 to the photo-diode 520. In some embodiments, the devices 530 may include the above mentioned stitch structures crossing boundaries of the dies 502, 504, 506 and 508. In other embodiments, the system 50 may include test keys as mentioned above. In some embodiments, when optical signals propagating through the devices 530 and passing through more the dies 502, 504, 506 and 508, the stitch loss is increased. Further, such stitch loss can be quantified by the test keys and/or the devices 530. In some embodiments, when a stitch loss is greater than a tolerance value, an additional electrical circuit may be used to pump and amplify the optical signal.

Figure 20:
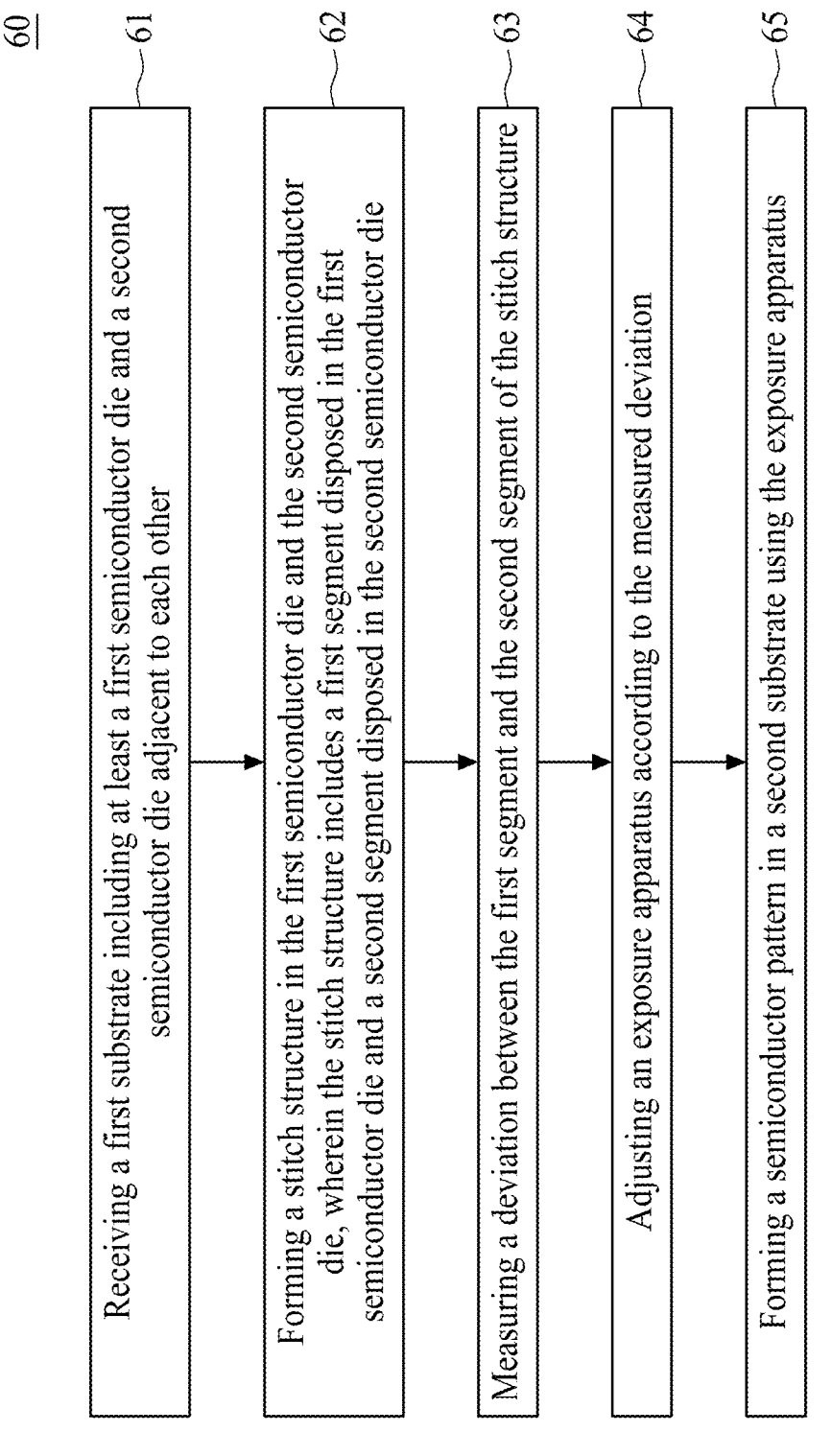
FIG. 20 is a flowchart representing a method for forming a semiconductor structure according to aspects of the present disclosure in one or more embodiments.

Please refer to FIG. 20, which a flowchart representing a method for forming a semiconductor structure 60. While the disclosed method 60 is illustrated and described herein as a series of acts or operations, it will be appreciated that an order of the illustrated acts or operations is not to be interpreted in a limiting sense. For example, some operations may be performed in a different order from, and/or concurrently with other acts or operations apart from, those illustrated and/or described herein. In addition, not all illustrated operations may be required to implement one or more aspects or embodiments of the invention described herein. Further, one or more of the operations described herein may be carried out in one or more separate operations and/or phases.

In operation 61, a first substrate is received. In some embodiments, the first substrate includes a plurality of semiconductor dies defined thereon. In some embodiments, at least a first semiconductor die DA and a second semiconductor die DB are adjacent to each other, as shown in FIG. 4. The first and second semiconductor dies DA and DB can be horizontally adjacent or vertically adjacent to each other.

In operation 62, a stitch pattern 200 or 202 is formed in the first semiconductor die DA and the second semiconductor die DB. Referring to FIGS. 4 and 8, in some embodiments, the stitch pattern 200 includes a first segment 120A in the first semiconductor die DA and a second segment 110B in the second semiconductor die DB. In other embodiments, the stitch pattern 200 includes a first segment 110A in the first semiconductor die DA and a second segment 100B in the second semiconductor die DB. In some embodiments, the first segment 120A or 110A and the second segment 110B or 100B may include various configurations and combinations as shown in FIGS. 3A to 3C; therefore, details thereof are omitted for brevity. Referring to FIG. 12, in some embodiments, the stitch pattern 202 includes a first portion in a first semiconductor die 401, and a second portion in a second semiconductor die 402. Referring to FIG. 16, in some embodiments, the stitch pattern 204 includes a first portion in a first semiconductor die 400, a second portion in a second semiconductor die 401, and a third portion in a third semiconductor die 402.

In operation 63, a deviation between the first segment 120A or 110A and the second segment 110B or 100B of the stitch pattern 200 is measured. As mentioned above, the stitch pattern 200 may be formed by a photolithography operation; therefore, such stitch patterns 200 can be used to monitor a mask shift occurring during the photolithography operation. Referring to FIG. 5B, in some embodiments, when a deviation Δy is observed in the stitch pattern 200, 202 or 204, a mask shift along the direction D2 is determined. Referring to FIG. 5C, in some embodiments, when a deviation Δx is observed in the stitch pattern 200, 202 or 204, an eccentric mask shift along the direction D1 is determined. Referring to FIG. 5D, in some embodiments, when a neck portion is observed in the stitch pattern 200, 202 or 204, a concentric mask shift along the direction D1 is determined.

Figure 21:
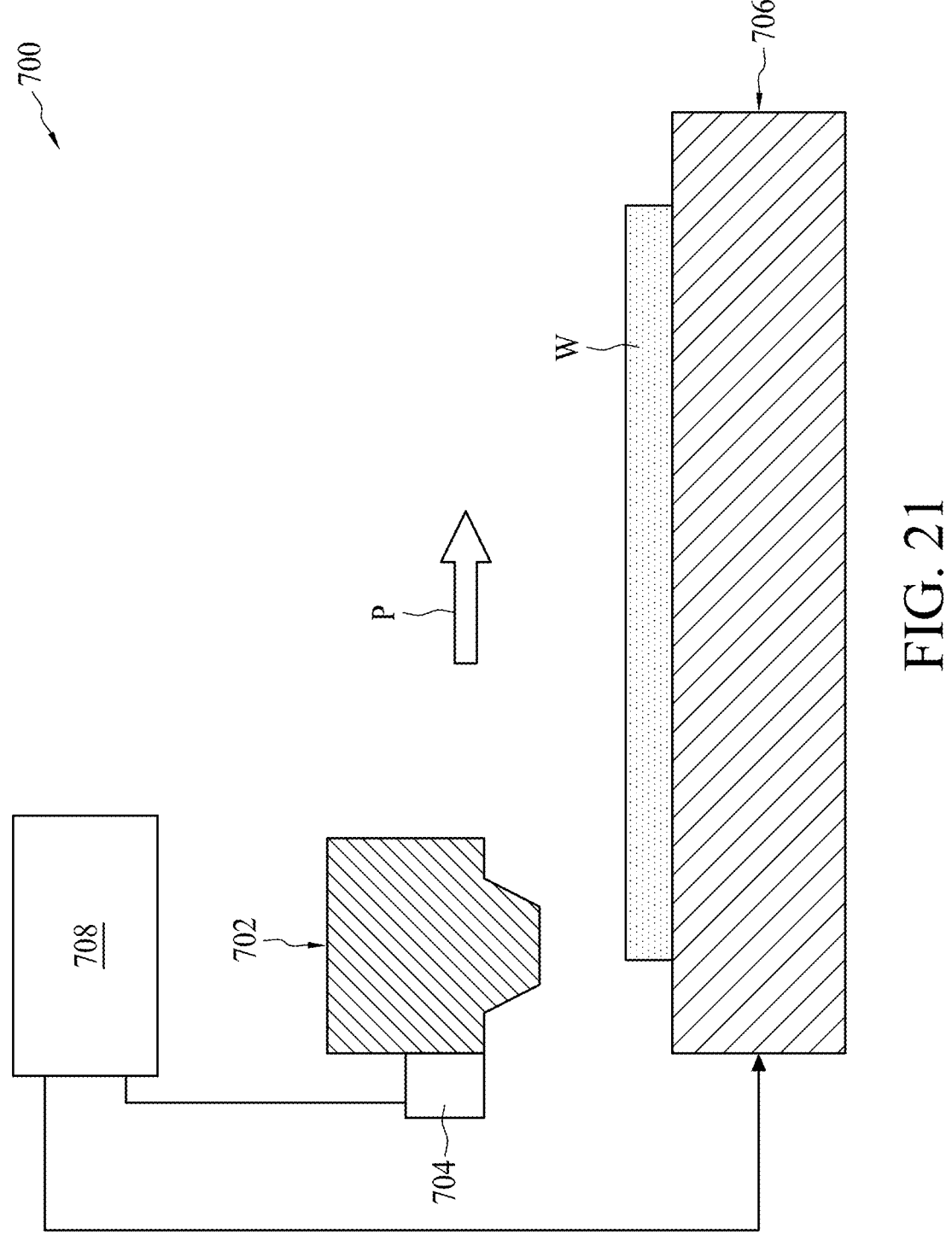
FIG. 21 is a schematic side view of a lithography exposure system in accordance with some embodiments.

In operation 64, an exposure apparatus is adjusted according to the measured deviation. Please refer to FIG. 21, which is a schematic side view of a lithography exposure system 700 in accordance with some embodiments. The lithography exposure system 700 includes an exposure apparatus 702, an alignment apparatus 704, a single wafer stage 706, and a controller 708. In some embodiments, the exposure apparatus 702 and the alignment apparatus 704 may have a same scan path P. In some embodiments, according to the measured deviation Δx and the measured deviation Δy, the exposure apparatus 702 may be adjusted in order to mitigate a mask shift issue. In some embodiments, when a neck portion is observed in a monitoring stitch pattern, an optical proximity correction (OPC) may be performed to mitigate an overlap issue.

In operation 65, a second substrate W is received, and a semiconductor pattern may be formed in the second substrate W after the exposure apparatus 702 is adjusted. In some embodiments, the semiconductor pattern may be a waveguide pattern or a grating coupler pattern, but the disclosure is not limited thereto.

The present disclosure provides a semiconductor stitch pattern and a semiconductor stitch structure that monitor manufacturing operations. In some embodiments, the semiconductor stitch structure includes the semiconductor stitch pattern. The semiconductor stitch pattern monitors a mask shifting issue. Accordingly, the manufacturing operations can be adjusted promptly. The semiconductor stitch structure monitors a stitch loss of a to-be-formed waveguide. Accordingly, countermeasures can be taken to mitigate the stitch loss issue.

In some embodiments, a semiconductor structure is provided. The semiconductor structure includes a plurality of semiconductor dies, a first stitch structure disposed in the plurality of semiconductor dies, and a second stitch structure disposed in at least two adjacent semiconductor dies of the plurality of semiconductor dies. The semiconductor dies are arranged to form a column or a row. The first stitch structure crosses at least two interfaces between the semiconductor dies. The second stitch structure crosses an interface between the at least two adjacent semiconductor dies.

In some embodiments, a semiconductor structure is provided. The semiconductor structure includes a plurality of semiconductor dies arranged to form a column-and-row array, and at least a stitch structure disposed in the semiconductor dies. The stitch structure includes a first portion and a second portion. The first portion is disposed on a first semiconductor die, and the second portion is disposed on a second semiconductor die. The first portion includes two grating coupler segments. The first semiconductor die and the second semiconductor die are adjacent to each other.

In some embodiments, a method for forming a semiconductor structure is provided. The method includes following operations. A first substrate is received. The first substrate includes at least a first semiconductor die and a second semiconductor die adjacent to each other. A stitch pattern is formed in the first semiconductor die and the second semiconductor die. The stitch pattern includes a first segment disposed in the first semiconductor die and a second segment disposed in the second semiconductor die. A deviation between the first segment and the second segment of the stitch pattern is measured. An exposure apparatus is adjusted according to the measured deviation. A semiconductor pattern is formed in a second substrate using the exposure apparatus.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a plurality of semiconductor dies arranged to form a column or a row;
   a first stitch structure disposed in the semiconductor dies, wherein the first stitch structure crosses at least two interfaces between the semiconductor dies; and
   a second stitch structure disposed in at least two adjacent semiconductor dies of the plurality of semiconductor dies, wherein the second stitch structure crosses an interface between the two adjacent semiconductor dies, wherein the first stitch structure and the second stitch structure individually have a serpentine shape.

2. The semiconductor structure of claim 1, wherein the first stitch structure and the second stitch structure comprise a same material.

3. The semiconductor structure of claim 1, wherein a width of the first stitch structure and a width of the second stitch structure have a ratio, and the ratio is between 0.95 and 1.05.

4. The semiconductor structure of claim 1, wherein a length of the first stitch structure is greater than a length of the second stitch structure.

5. The semiconductor structure of claim 1, wherein the first stitch structure comprises two first grating coupler segments disposed in a first semiconductor die of the plurality of semiconductor dies, and the second stitch structure comprises two second grating coupler segments disposed in a second semiconductor die of the plurality of the semiconductor dies.

6. The semiconductor structure of claim 1, wherein the first stitch structure comprises at least one first U-shaped segment disposed in a first semiconductor die of the plurality of semiconductor dies, and the second stitch structure comprises at least one second U-shaped segment disposed in a second semiconductor die of the plurality of semiconductor dies.

7. The semiconductor structure of claim 5, wherein the first stitch structure comprises a plurality of long segments disposed in the second semiconductor die of the plurality of the semiconductor dies.

8. A semiconductor structure comprising:
   a plurality of semiconductor dies arranged to form a column or a row;
   a first stitch structure disposed in the semiconductor dies, wherein the first stitch structure crosses at least two interfaces between the semiconductor dies; and
   a second stitch structure disposed in at least two adjacent semiconductor dies of the plurality of semiconductor dies, wherein the second stitch structure crosses an interface between the two adjacent semiconductor dies, wherein the first stitch structure and the second stitch structure individually have a U shape.

9. The semiconductor structure of claim 8, wherein the first stitch structure and the second stitch structure comprise a same material.

10. The semiconductor structure of claim 8, wherein a width of the first stitch structure and a width of the second stitch structure have a ratio, and the ratio is between 0.95 and 1.05.

11. The semiconductor structure of claim 8, wherein a length of the first stitch structure is greater than a length of the second stitch structure.

12. The semiconductor structure of claim 8, wherein the first stitch structure comprises two first grating coupler segments disposed in a first semiconductor die of the plurality of semiconductor dies, and the second stitch structure comprises two second grating coupler segments disposed in a second semiconductor die of the plurality of the semiconductor dies.

13. The semiconductor structure of claim 12, wherein the first stitch structure comprises two long segments disposed in the second semiconductor die of the plurality of the semiconductor dies and coupled to the two first grating coupler segments.

14. The semiconductor structure of claim 13, wherein the first stitch structure comprises at least one first U-shaped segment disposed in a third semiconductor die of the plurality of semiconductor dies and coupled to the two long segments.

15. The semiconductor structure of claim 12, wherein the second stitch structure comprises at least one second U-shaped segment disposed in a third semiconductor die of the plurality of semiconductor dies and coupled to the two second grating coupler segments.

16. A semiconductor structure comprising:
  a plurality of semiconductor dies arranged to form a column or a row;
  a first stitch structure disposed in the semiconductor dies, wherein the first stitch structure crosses at least two interfaces between the semiconductor dies; and a second stitch structure disposed in at least two adjacent semiconductor dies of the plurality of semiconductor dies, wherein the second stitch structure crosses an interface between the two adjacent semiconductor dies,
  wherein the first stitch structure comprises at least one first U-shaped segment disposed in a first semiconductor die of the plurality of semiconductor dies, and the second stitch structure comprises at least one second U-shaped segment disposed in a second semiconductor die of the plurality of semiconductor dies.

17. The semiconductor structure of claim 16, wherein the first stitch structure and the second stitch structure comprise a same material.

18. The semiconductor structure of claim 16, wherein a width of the first stitch structure and a width of the second stitch structure have a ratio, and the ratio is between 0.95 and 1.05.

19. The semiconductor structure of claim 16, wherein a length of the first stitch structure is greater than a length of the second stitch structure.

20. The semiconductor structure of claim 16, wherein the first stitch structure comprises two first grating coupler segments disposed in a third semiconductor die of the plurality of semiconductor dies, and the second stitch structure comprises two second grating coupler segments disposed in a fourth semiconductor die of the plurality of the semiconductor dies.

* * * * *